(12) United States Patent
Honda

(10) Patent No.: US 7,755,105 B2
(45) Date of Patent: Jul. 13, 2010

(54) CAPACITOR-LESS MEMORY

(75) Inventor: Tatsuya Honda, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 70 days.

(21) Appl. No.: 12/127,424

(22) Filed: May 27, 2008

(65) Prior Publication Data

US 2008/0308802 A1 Dec. 18, 2008

(30) Foreign Application Priority Data

Jun. 12, 2007 (JP) ............... 2007-154610

(51) Int. Cl.
*H01L 29/10* (2006.01)
(52) U.S. Cl. .............. 257/195; 257/66; 257/213; 257/289; 257/368; 257/E27.081
(58) Field of Classification Search ........... 257/27, 257/57–61, 66–71, 192–195, 202–211, 213, 257/214, 288, 289, 368–401, E27.059, E28.081
See application file for complete search history.

(56) References Cited

U.S. PATENT DOCUMENTS

| 4,755,865 | A | | 7/1988 | Wilson et al. |
| 4,899,202 | A | | 2/1990 | Blake et al. |
| 5,315,132 | A | | 5/1994 | Yamazaki |
| 5,821,563 | A | | 10/1998 | Yamazaki et al. |
| 5,914,504 | A | * | 6/1999 | Augusto ............. 257/192 |
| 6,225,668 | B1 | * | 5/2001 | Shindo et al. ........ 257/368 |
| 7,518,196 | B2 | * | 4/2009 | Chau et al. .......... 257/401 |
| 2007/0194379 | A1 | * | 8/2007 | Hosono et al. ....... 257/347 |

FOREIGN PATENT DOCUMENTS

| EP | 1 237 193 A2 | 9/2002 |
| JP | 8-213624 | 8/1996 |
| JP | 10-92952 | 4/1998 |
| JP | 2002246571 | 8/2002 |

\* cited by examiner

*Primary Examiner*—Evan Pert
*Assistant Examiner*—Scott R Wilson
(74) *Attorney, Agent, or Firm*—Husch Blackwell Sanders LLP

(57) ABSTRACT

It is an object of the present invention to provide a capacitor-less memory which can prevent a change of a threshold voltage due to flowing out of carriers and improve the memory retention property without a complicated structure. In the capacitor-less memory which uses a transistor, the transistor includes a source region, a drain region, an active layer region which is provided between the source region and the drain region, and a gate electrode which is adjacent to the active layer region with an insulating film interposed therebetween. The source region is formed of a semiconductor having a larger band gap than a band gap of a semiconductor of the active layer region and a band gap of a semiconductor of the drain region, and a heterojunction is formed at the interface between the source region and the active layer region.

20 Claims, 33 Drawing Sheets

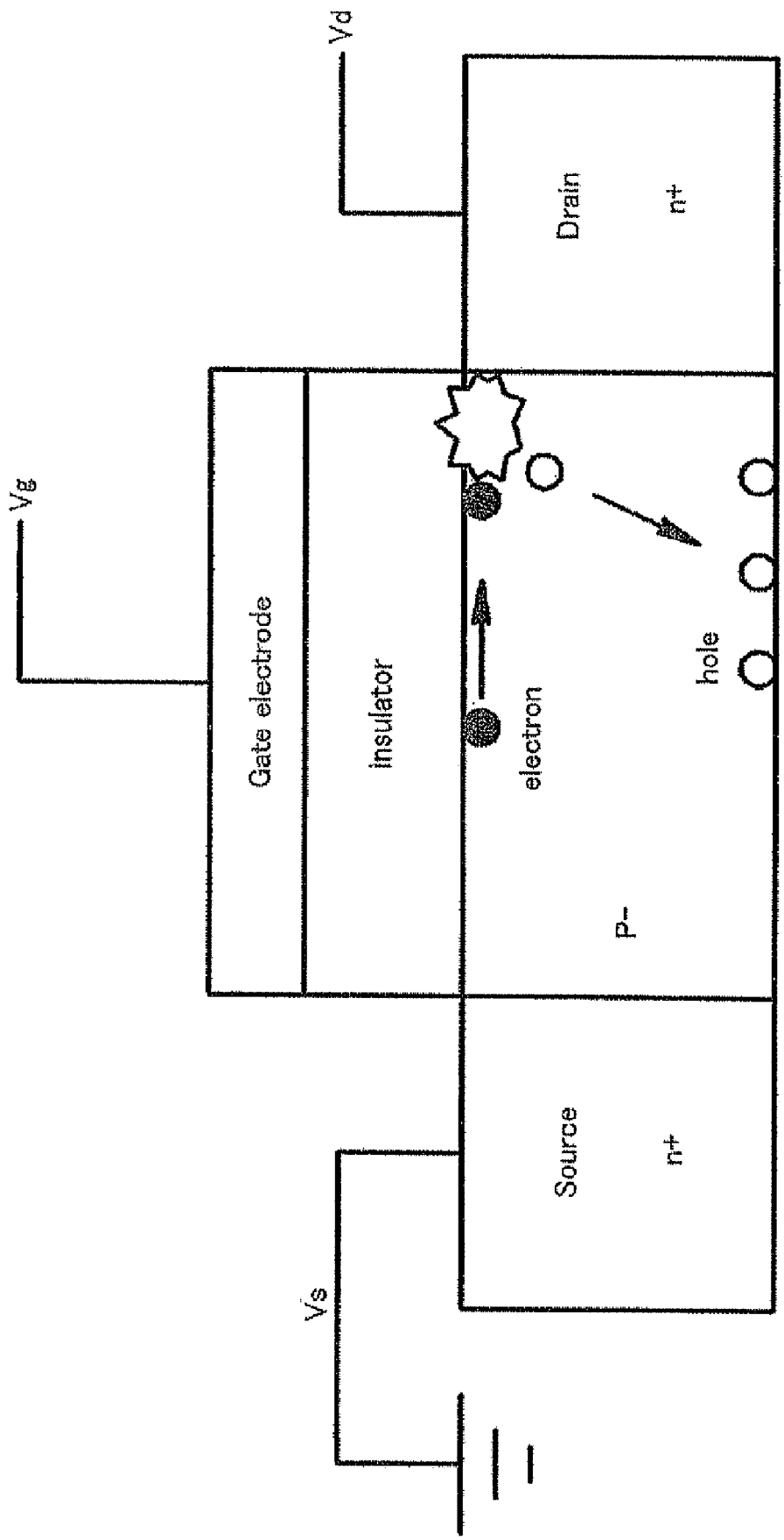

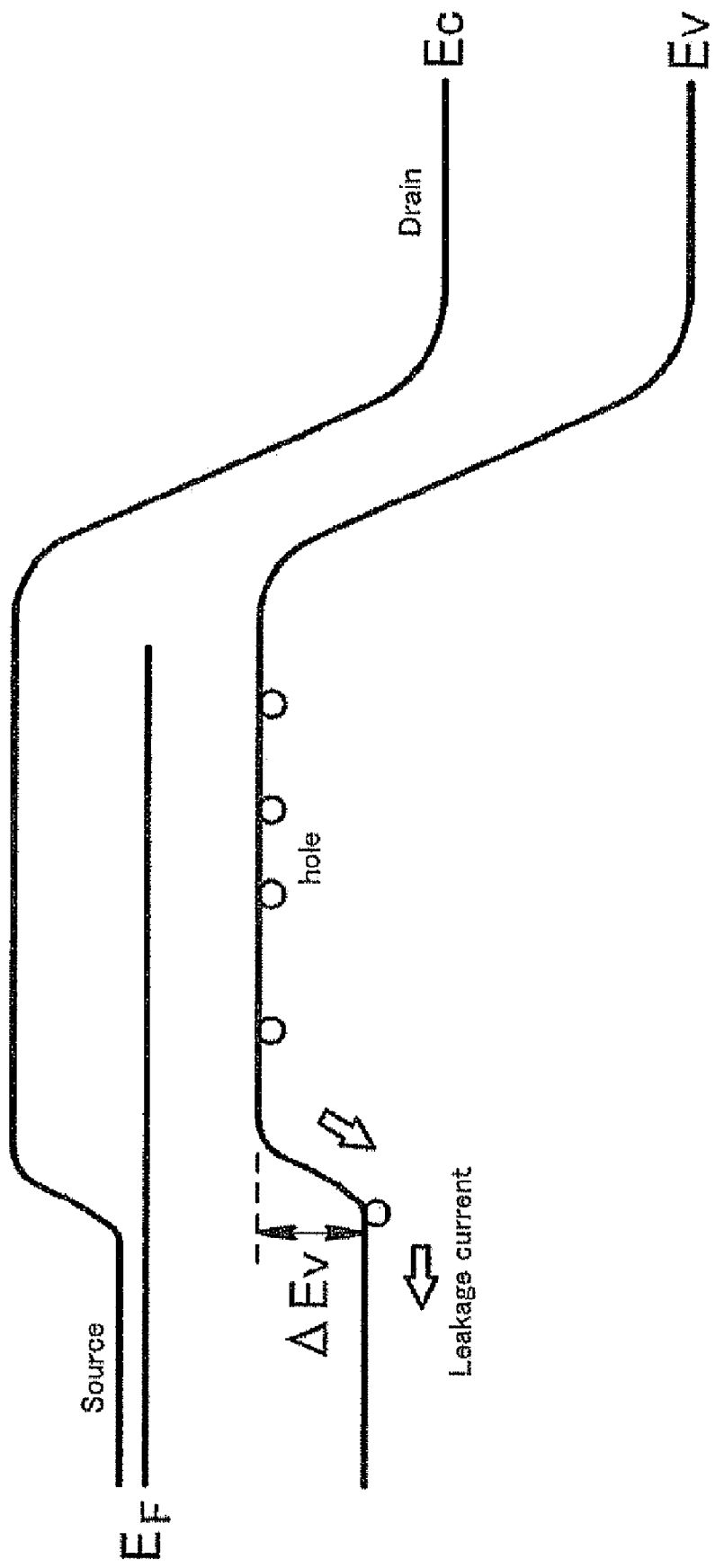

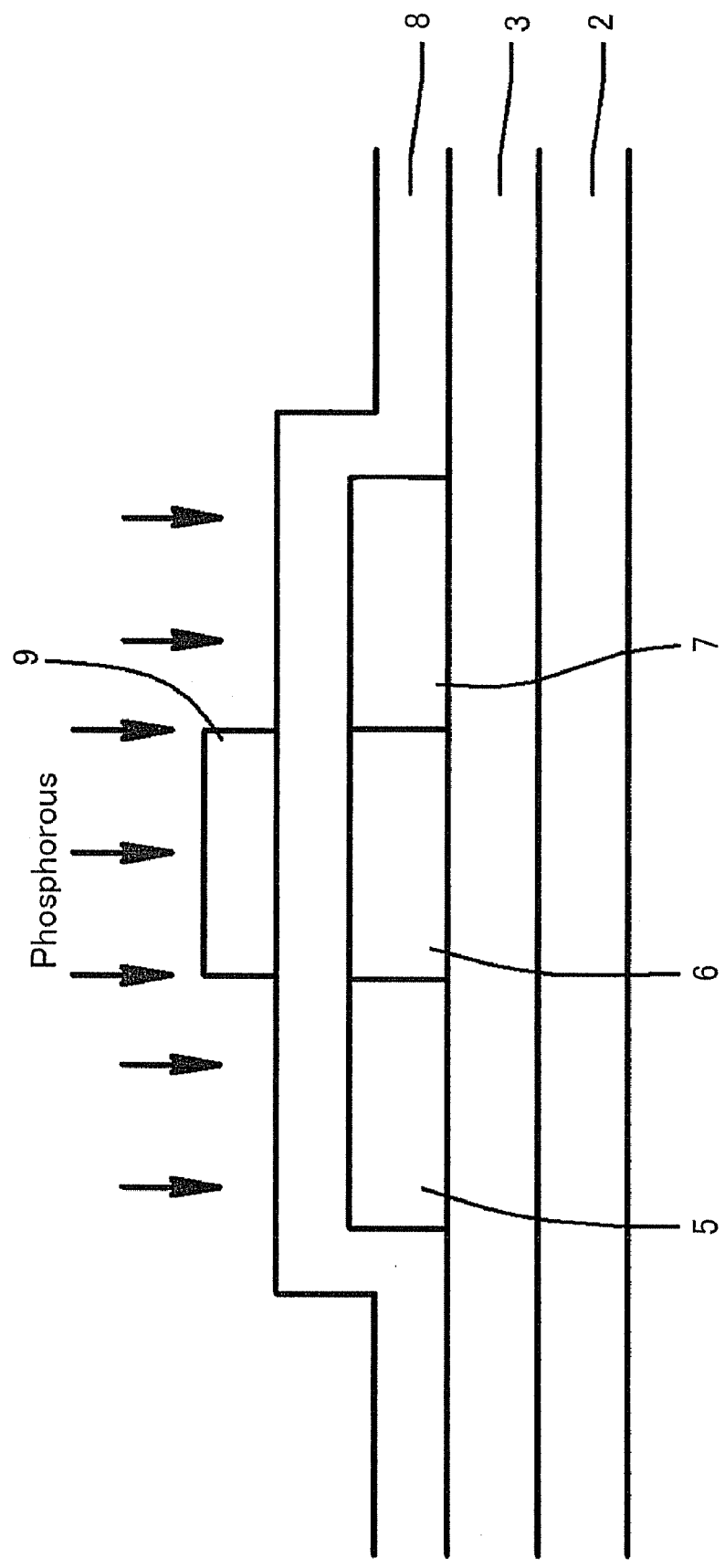

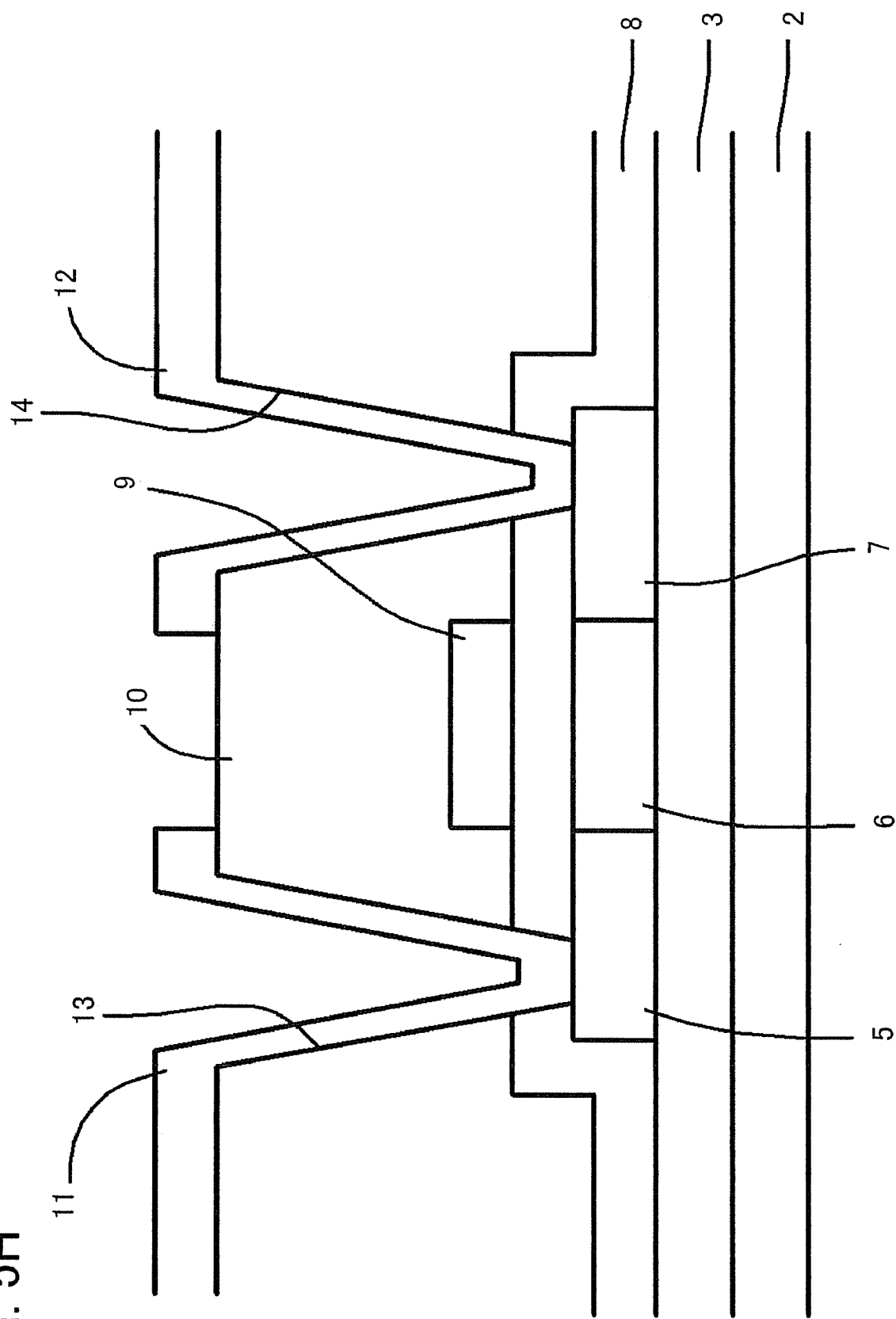

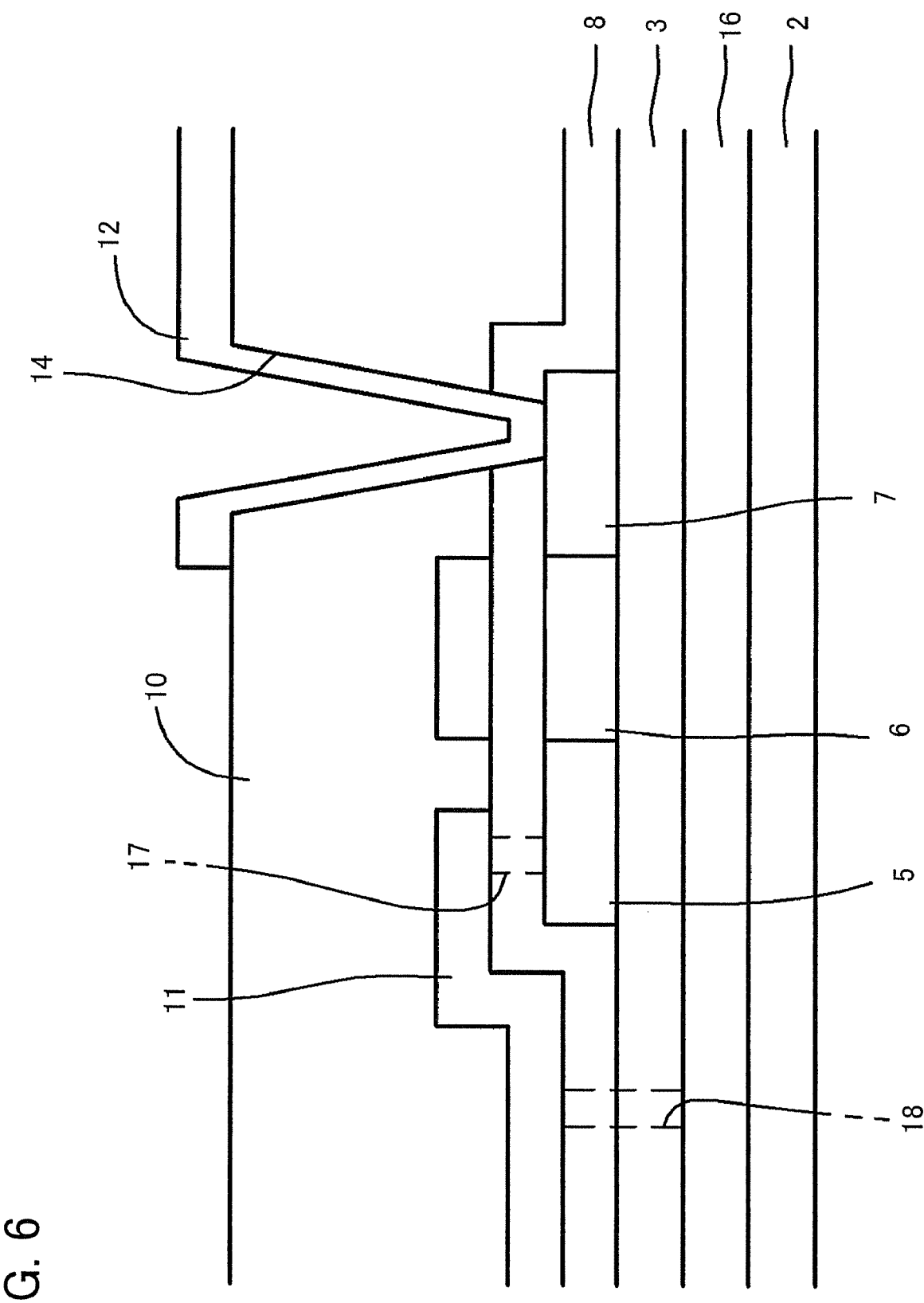

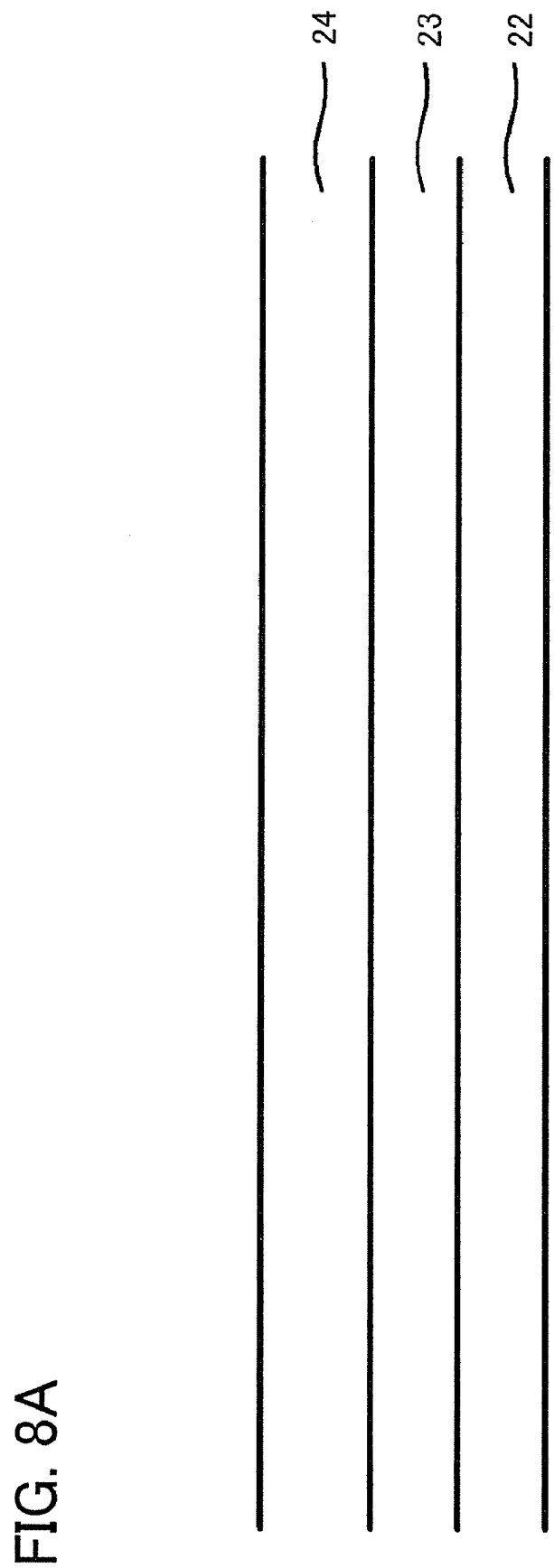

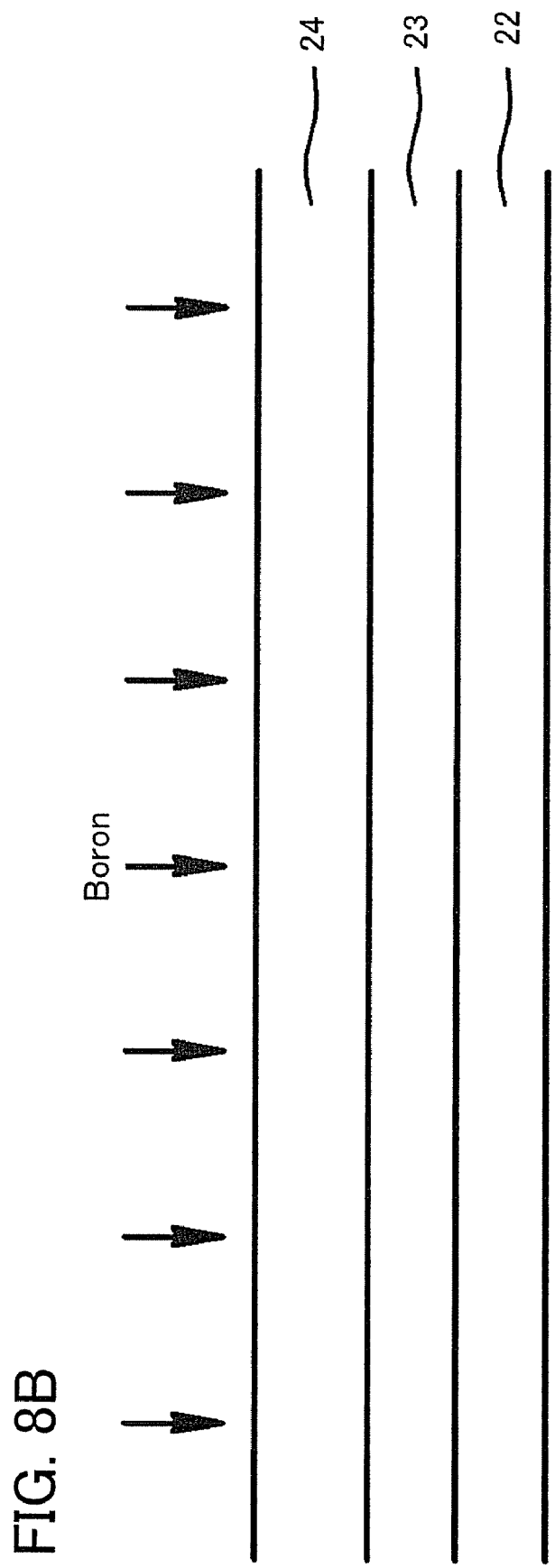

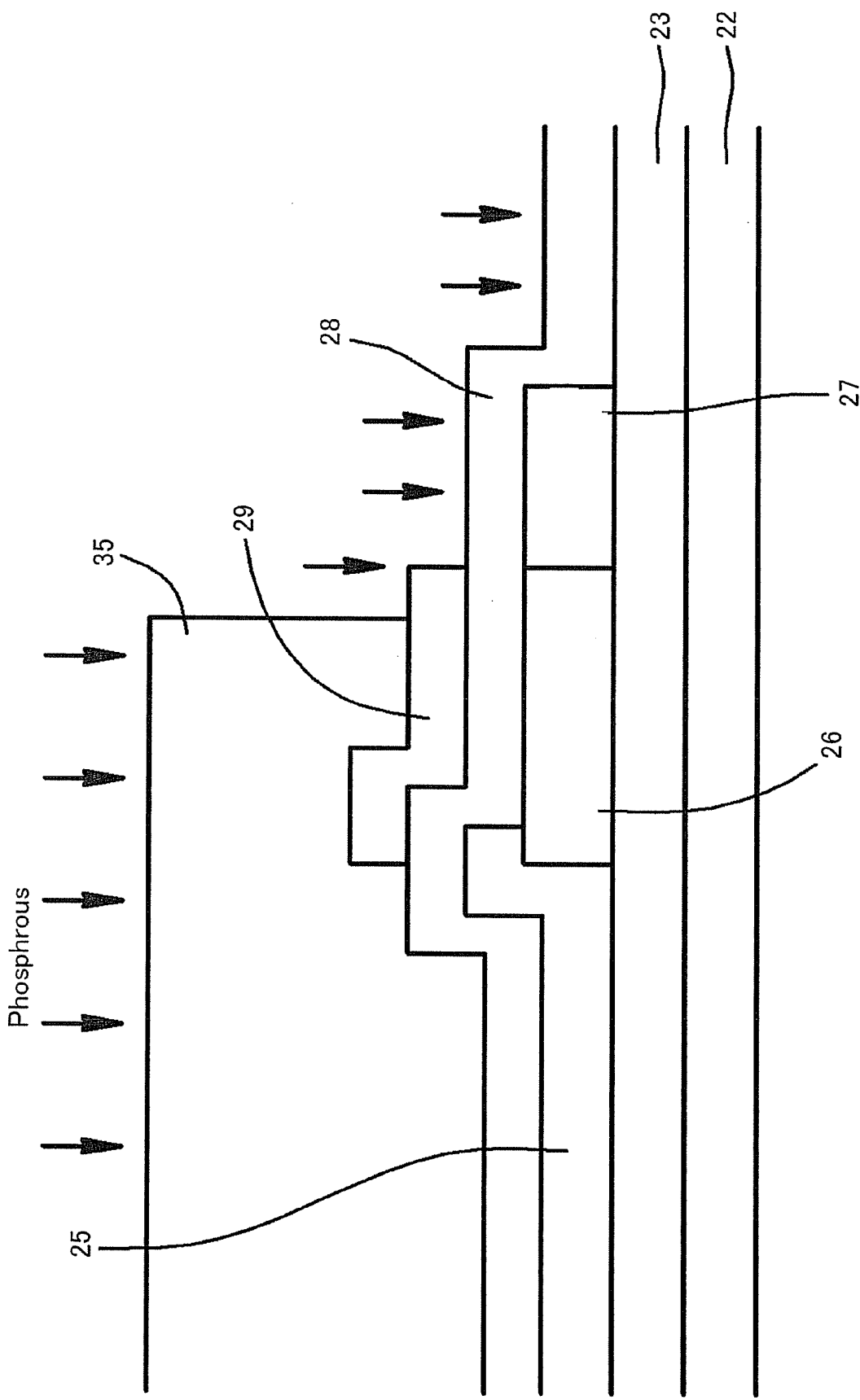

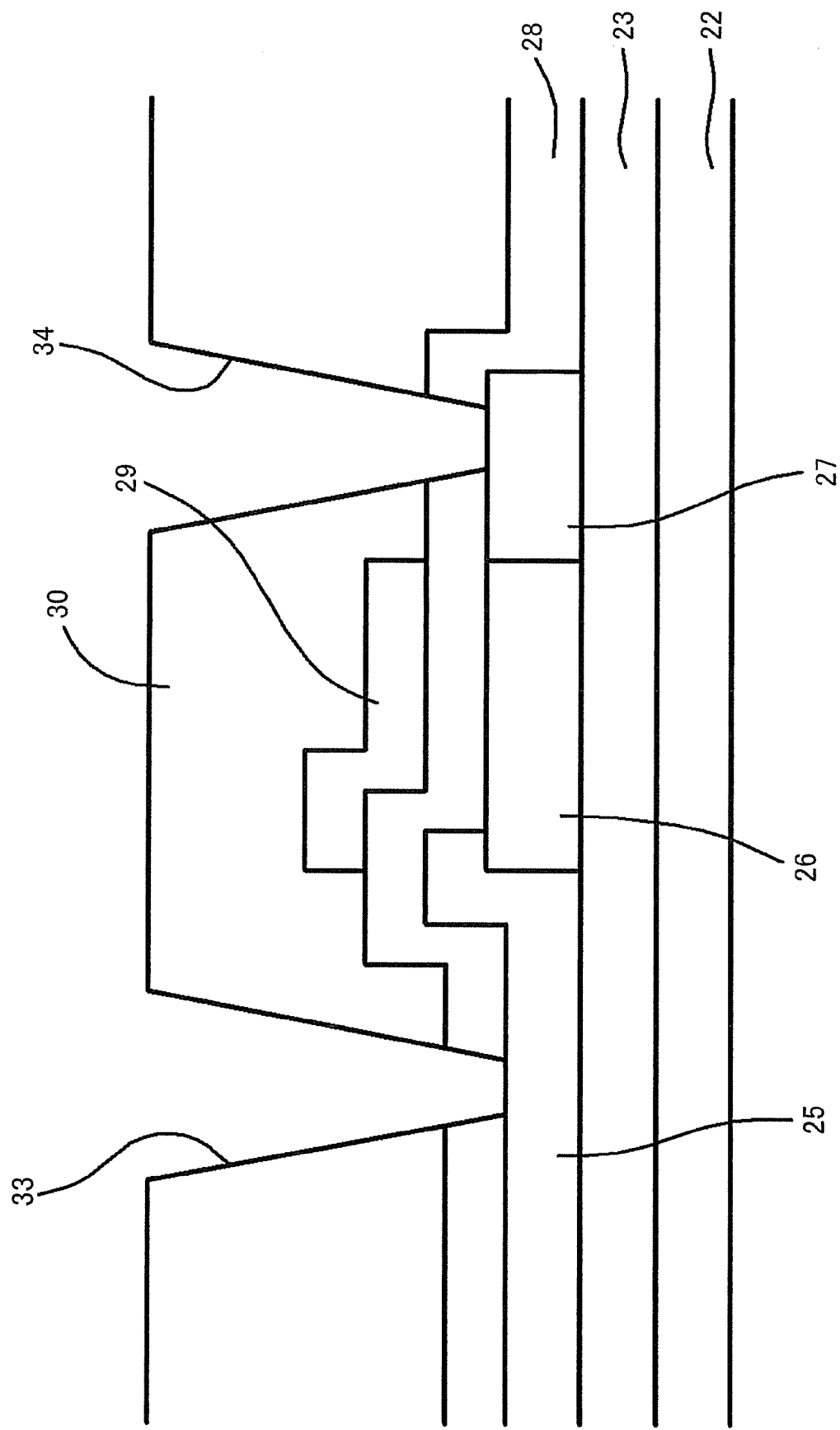

CAPACITOR-LESS MEMORY

BACKGROUND OF THE INVENTION

1. Field of the Invention

The present invention relates to a capacitor-less memory. In particular, the present invention relates to a capacitor-less memory including a transistor that has both functions of selecting a memory cell and retaining information.

2. Description of the Related Art

For higher integration of a DRAM, so-called capacitor-less DRAM without a capacitor (storage capacitor) to hold charge has attracted attention (see e.g., Reference 1: Japanese Published Patent Application No. 2002-246571, Reference 2: Japanese Published Patent Application No. H8-213624, and Reference 3: Japanese Published Patent Application No. H10-92952). Unlike a conventional DRAM that stores charge in a storage capacitor, a capacitor-less DRAM stores charge in a switching transistor. In the capacitor-less DRAM, since the switching transistor has both functions of selecting a memory cell and retaining information, the storage capacitor is not needed, and thus an area in which elements of a DRAM are formed is decreased, which is advantageous in high integration of a DRAM.

The principle of operation of a capacitor-less DRAM will be described with reference to FIGS. 1, 2A, and 2B. FIG. 1 shows a circuit diagram of one cell of a capacitor-less DRAM. In this example, an n-channel transistor is used.

The writing operation of the capacitor-less DRAM shown in FIG. 1 will be described. First, a voltage which is greater than or equal to a threshold voltage of a transistor 101 is applied to a word line 102, and then the transistor 101 is turned on. Carriers (electrons) are accelerated by an electric field which is generated by application of a positive voltage to a bit line 103, and hot carriers are generated at a drain edge of the transistor 101. The behavior of carriers in the transistor 101 of FIG. 1 is schematically shown in FIG. 2A. The hot carriers which are generated collide with semiconductor atoms (e.g., silicon atoms), so that electrons and holes are newly generated. The generated electrons move to a drain side, and holes move to a substrate side (that is, a side away from a gate electrode) by receiving electric field in a semiconductor active layer. A band structure of bottom of the semiconductor active layer (the substrate side) is shown in FIG. 2B. Here, $E_F$ is energy of Fermi level, $E_C$ is energy of the bottom of a conduction band, and $E_V$ is energy of top of a valence band. The holes which have moved to the bottom of the active layer are trapped between a source and a drain due to a potential barrier $\Delta E_V$ formed at an interface between the source and the active layer and stored in the bottom of the active layer. In this manner, a threshold voltage of the transistor is decreased when holes are stored in bottom of the active layer, and as a result, current which flows in the transistor at the time of reading a memory is increased. For example, this state can be set to be "1". In this manner, holes are stored in the bottom of the active layer, so that writing of the memory is performed.

Note that, as described above, since it is necessary to generate hot carriers to write data in a memory, the transistor is operated in a saturation region. That is, when the threshold voltage of the transistor is set to be Vth, the values of a drain voltage Vd (or a bit line voltage) and a gate voltage Vg (or a word line voltage) are set so that (Vd−Vs)>(Vg−Vs)−Vth is satisfied.

Erasing of a memory, that is, writing "0" is performed in such a way that a negative drain voltage is used and then holes are discharged into the drain side. Accordingly, the threshold voltage returns to a state before holes are stored.

As described above, in the capacitor-less DRAM, the threshold voltage of a transistor varies depending on whether the state of the memory is "1" or "0", and as a result, current which flows in the semiconductor at the time of reading the memory varies. The current is detected by, for example, a sense amplifier, so that whether the state of the memory is "1" or "0" can be determined.

As described above, since the capacitor-less DRAM does not need a storage capacitor, the capacitor-less DRAM has an advantage in high integration of DRAM. However, potential barrier $\Delta E_V$ on the source side to trap holes in a conventional memory element formed by silicon active layer is not sufficiently high. Therefore, holes stored in the bottom of the active layer surpass the potential barrier $\Delta E_V$ at a certain ratio and flow to the source side with time (leakage current). This leakage current is proportional to $\exp(-\Delta E_V/kBT)$: (Formula 1, where kB is Boltzmann constant and T is absolute temperature). As a result, the threshold voltage changes and reading error of the memory occurs.

To prevent stored holes (majority carriers) from flowing out, a memory cell including a MOS transistor in which a first semiconductor layer, a second semiconductor layer, and a third semiconductor layer are stacked on a substrate in this order and which has a double heterojunction structure under a channel region is suggested in Reference 3. The first semiconductor layer, the second semiconductor layer, and the third semiconductor layer can be a p-type silicon layer, a p-type silicon germanium layer, and a p-type silicon layer, respectively, for example. In this manner, the majority carriers can be prevented from flowing out by trapping the majority carriers in the second semiconductor layer included in the double heterostructure.

However, there is a problem in that three semiconductor layers are needed so as to have a double heterojunction and a structure becomes complicated in the memory cell described in Reference 3.

SUMMARY OF THE INVENTION

A main object of the present invention is to provide a capacitor-less memory which can prevent a change of the threshold voltage due to flowing out of stored carriers and improve the memory retention property without a complicated structure.

In order to solve the foregoing problems, a capacitor-less memory of the present invention includes the following transistor. The transistor includes a source region, a drain region, an active layer region which is provided between the source region and the drain region, and a gate electrode which is adjacent to the active layer region with an insulating film interposed therebetween. The source region is formed of a semiconductor having a larger band gap than a semiconductor of the active layer region and a semiconductor of the drain region. A heterojunction is formed between the source region and the active layer region.

In the capacitor-less memory of the present invention, the source region is formed of the semiconductor having a larger band gap than the active layer region and the drain region, and the heterojunction is formed between the source region and the active layer region. This simple element structure enable a potential barrier on a source side for carriers (holes in the case where an n-channel transistor is used, and electrons in the case where a p-channel transistor is used) which are stored on the bottom of the active layer region and change the threshold voltage to increase. Therefore, the amount of the stored carriers which flow out or leakage current can be reduced. Therefore, the change of the threshold voltage of the memory due to flowing out of carriers can be prevented, and the memory retention property can be greatly improved.

Preferably, the active layer region and the drain region are formed of semiconductors having the same band gap. Note that, similarly to the source region, the drain region can also be formed of a semiconductor having a larger band gap than the semiconductor of the active layer region; however, when the band gap of the drain region is increased, there arises a problem in that generation efficiency of electrons and holes by hot carriers is decreased and the driving voltage of the memory element is increased. Therefore, when both the source region and the drain region are formed of semiconductors each having a larger band gap than the active layer region, it is necessary to satisfy the following relationship: the band gap of the source region>the band gap of the drain region>the band gap of the active layer region.

In a embodiment, the semiconductor of the active layer region can be formed of germanium, and the semiconductor of the source region can be formed of silicon germanium.

In the case where the semiconductor of the active layer region is formed of a semiconductor selected from a group of silicon, germanium, and silicon germanium, the semiconductor of the source region can be formed of a semiconductor selected from a group of zinc sulfide, zinc oxide, gallium nitride, gallium phosphide, gallium arsenide, aluminum antimonide, indium phosphide, cadmium telluride, zinc telluride, zinc selenide, cadmium sulfide, cadmium selenide, silicon carbide, aluminum phosphide, and aluminum arsenide. Considering lattice matching, it is particularly preferable that the semiconductor of the source region be formed of a semiconductor selected from a group of zinc sulfide, gallium arsenide, gallium phosphide, indium phosphide, aluminum phosphide, and aluminum arsenide.

In another embodiment, the semiconductor of the active layer region can be formed of single crystal silicon or polycrystalline silicon and the semiconductor of the source region can be formed of amorphous silicon or microcrystal silicon. By forming the active layer region and the source region of silicon materials, film formation and processing can be simplified.

Preferably, the insulating film can be formed of an insulating material having a dielectric constant of 8 or more. A large number of carriers can be generated with a low gate voltage by use of such the insulating film that has a high dielectric constant between the gate electrode and the active layer region.

According to another aspect of the present invention, a capacitor-less memory is provided in which a plurality of transistors having the above structure is included, and a plurality of word lines each connected to respective gate electrodes of the transistors, a plurality of common lines each connected to respective source regions of the transistors, and a plurality of bit lines each connected to respective drain regions of the transistors are included. The common lines and the bit lines extend almost in parallel and are almost perpendicular to the word lines. The transistors which are adjacent to each other between one of a plurality of common lines in a direction along which the word lines extend are arranged so that source regions of the transistors are close to each other, and the source regions of the transistors which are adjacent to each other are connected to the same common line which is located therebetween. In this manner, the number of common lines can be reduced by use of a common line between adjacent memory cells in common, and a memory device can be further miniaturized.

According to the structure of the present invention described above, by a simple structure, a change of a threshold voltage of a capacitor-less memory due to flowing out of carriers can be prevented, and a memory retention property can be improved.

BRIEF DESCRIPTION OF THE DRAWINGS

FIG. 2A is a schematic diagram showing movement of carriers in the capacitor-less memory shown in FIG. 1.

FIG. 2B is a schematic diagram showing an energy band structure of a lower part of an active layer (a substrate side) of the capacitor-less memory shown in FIG. 1.

FIG. 5E is a cross-sectional view showing a manufacturing process of the transistor shown in FIG. 3.

FIG. 5H is a cross-sectional view showing a manufacturing process of the transistor shown in FIG. 3.

FIG. 6 is a cross-sectional view showing a modification of the transistor shown in FIG. 3.

FIG. 8A is a cross-sectional view showing a manufacturing process of the transistor shown in FIG. 7.

FIG. 8B is a cross-sectional view showing a manufacturing process of the transistor shown in FIG. 7.

FIG. 8G is a cross-sectional view showing a manufacturing process of the transistor shown in FIG. 7.

FIG. 8H is a cross-sectional view showing a manufacturing process of the transistor shown in FIG. 7.

DETAILED DESCRIPTION OF THE INVENTION

Embodiment Mode

Figure 3:
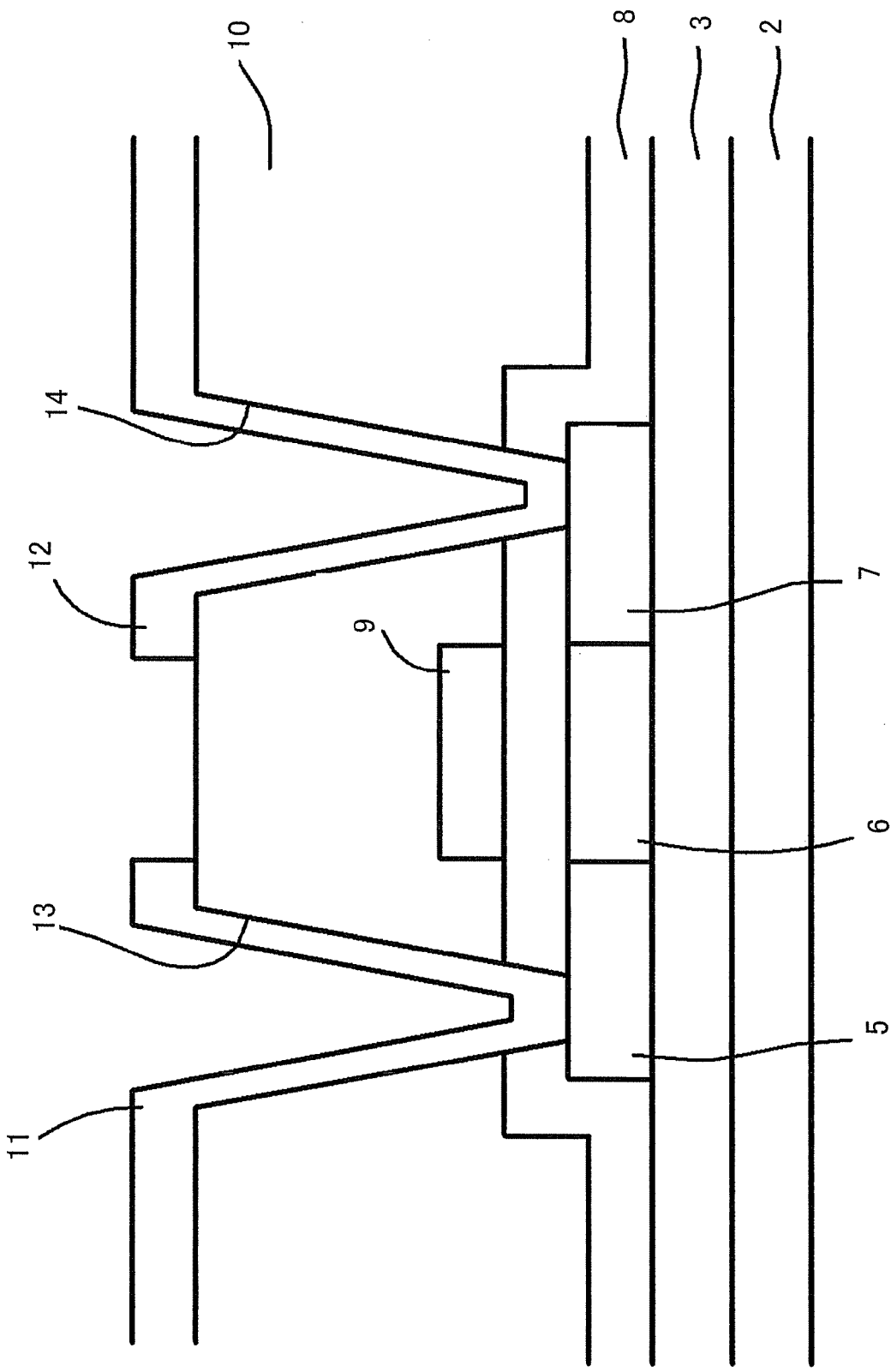
FIG. 3 is a cross-sectional view showing a preferred embodiment of a transistor which can be used for a capacitor-less memory based on the present invention.

FIG. 3 is a cross-sectional view which shows a preferred embodiment of a transistor that can be used as a memory cell of a capacitor-less memory based on the present invention. In this transistor, a silicon oxynitride film is formed as a base insulating film 3 over a substrate 2 which is formed of a glass substrate or the like, and an island-shaped semiconductor film that includes a source region 5, an active layer region 6, and a drain region 7 is formed over the base insulating film 3. A gate electrode 9 formed of tantalum nitride is formed over the active layer region 6, so that a gate insulating film 8 formed of yttrium oxide is interposed therebetween. An interlayer insulating film 10 that has a planarized surface formed of silicon oxynitride is provided over the gate electrode 9, and conductive films 11 and 12 that are formed by stacking a titanium film, an aluminum film, and a titanium film are formed over the interlayer insulating film 10. Contact openings 13 and 14 which reach the source region 5 and the drain region 7 are formed in the interlayer insulating film 10. The conductive films 11 and 12 are connected to the source region 5 and the drain region 7 through these contact openings 13 and 14, respectively. The conductive film 11 connected to the source region 5 can function as a common line, and the conductive film 12 connected to the drain region 7 can function as a bit line.

Figure 1:
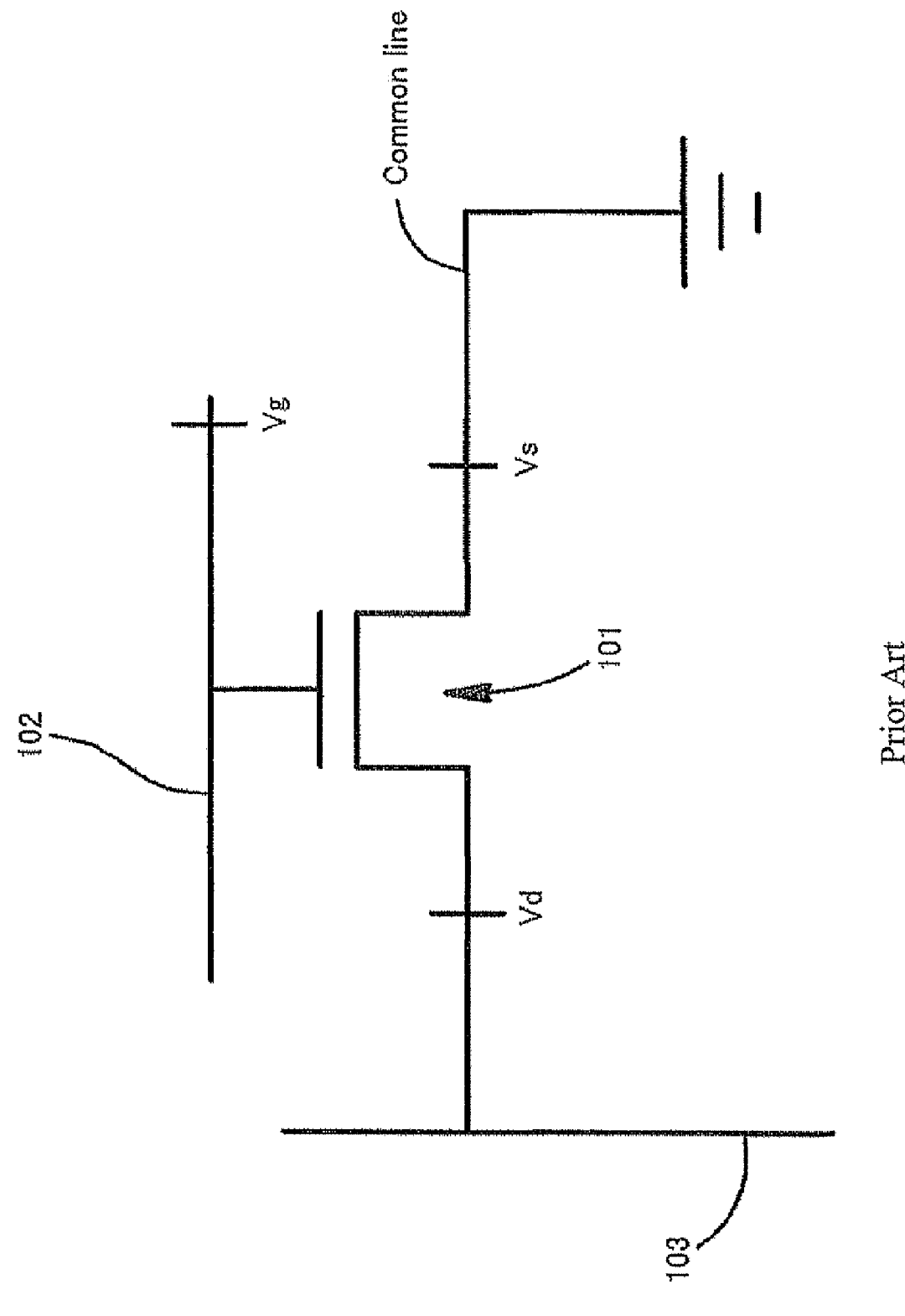
FIG. 1 is a circuit diagram showing a circuit for one cell of a capacitor-less DRAM.

The source region 5 and the drain region 7 are $n^+$ type semiconductors which include high density donor impurities, and the active layer region 6 is $p^-$ type semiconductor which includes low density acceptor impurities. That is, the transistor is formed as an n-type MISFET, and the principle of operation thereof is similar to the above principle which is described with reference to FIGS. 1, 2A, and 2B. Such an n-type transistor is easy to generate hot carriers obtained by accelerating electrons; therefore, such an n-type transistor is easy to generate holes which are stored in the bottom of a semiconductor film 4 and which change a threshold voltage of a transistor, so that such an n-type transistor is suited as a memory cell of a capacitor-less memory.

A quartz substrate, a single crystal silicon substrate, a metal substrate, a heat-resistant plastic substrate, or the like as well as a glass substrate can be used for the substrate 2.

The base insulating film 3 has a function to prevent an impurity in the substrate 2 from diffusing to the active layer region 6, may be formed of an insulating material that has a heat resistance property and a chemical resistance which are needed for a film formation process and can be formed of a single-layer film of a silicon nitride film, a silicon oxide film, a tetraethoxysilane (TEOS) film, or the like as well as a silicon oxynitride film or a multilayer film which has a combination of these. Note that the formation of the base insulating film 3 can be omitted depending on the kind of the substrate 2. For example, when a quartz substrate is used, the base insulating film 3 is not necessarily provided because the quartz substrate does not include alkaline impurities which degrade properties of a transistor.

Although the gate insulating film 8 can be formed of a material such as silicon oxynitride or the like which is the same as the base insulating film 3, it is preferable to use an insulating film having a high dielectric constant (also referred to as a High-k insulating film), like yttrium oxide. This is because a large number of carriers can be generated with a low gate voltage by using a material having a high dielectric constant for the gate insulating film. For the High-k insulating material, there are typically a hafnium (Hf)-based material, an yttrium (Y)-based material, a zirconium (Zr)-based material, and a lantern (La)-based material. The Hf-based material contains hafnium oxide, hafnium silicate nitride, hafnium ruthenium, hafnium lanthanate, hafnium aluminate nitride, or the like, and a dielectric constant $\in$ is about 8 to 30. The Y-based material contains yttrium oxide, a monoclinic crystal structure (YAM) of yttrium aluminum oxide, yttrium aluminum garnet (YAG), yttrium aluminate, or the like. The Zr-based material contains zirconium oxide, for example. The La-based material contains lanthanum oxide, for example. Each dielectric constant $\in$ of the Y-based material, the Zr-based material, and the La-based material is around 20. The High-k film is usually formed by a method using a gas source, such as CVD (chemical vapor deposition), MOCVD (metal organic chemical vapor deposition), PVD (physical vapor deposition), PLD (pulsed laser deposition), or the like, and the High-k film is less likely to be formed by sputtering. When a material of the gate insulating film 8 is selected, it is desirable to consider affinity with a semiconductor material used to form the semiconductor film 4. For example, in the case where silicon is used as a semiconductor material, when hafnium silicate nitride is used for the gate insulating film 8, good transistor properties are obtained, which is preferable. When germanium is used as a semiconductor material, yttrium oxide is preferable.

The gate electrode 9 can be formed of an element selected from tantalum (Ta), tungsten (W), titanium (Ti), molybdenum (Mo), aluminum (Al), copper (Cu), chromium (Cr), or niobium (Nb); or an alloy or compound material which contains any of these elements as its main component, as well as tantalum nitride as long as the material of the gate electrode 9 has conductivity. Further, silicide in which silicon is added with phosphorus (P), boron (B), nickel (Ni), cobalt (Co), chromium (Cr), or the like can be used.

The interlayer insulating film 10 can be formed of a material similar to the base insulating film 3. An organic material (e.g., polyimide, polyamide, or the like) may be applied by a droplet discharging method (ink-jet method) or a spin coating method. The use of a spin coating method has an advantage in that the surface of the interlayer insulating film 10 can be easily planarized. After an inorganic material is deposited by CVD, planarization can be performed by CMP (chemical mechanical polishing). When a droplet discharging method is used, the contact openings 13 and 14 can be directly formed; therefore, a process by which the contact openings 13 and 14 are separately formed can be omitted.

The material of each of the conductive films 11 and 12, which are connected to the source region 5 and the drain region 7 and function as a common line and a bit line, respectively is not limited to a stacked film of a titanium film, an aluminum film, and a titanium film as long as the material has conductivity.

Figure 4:
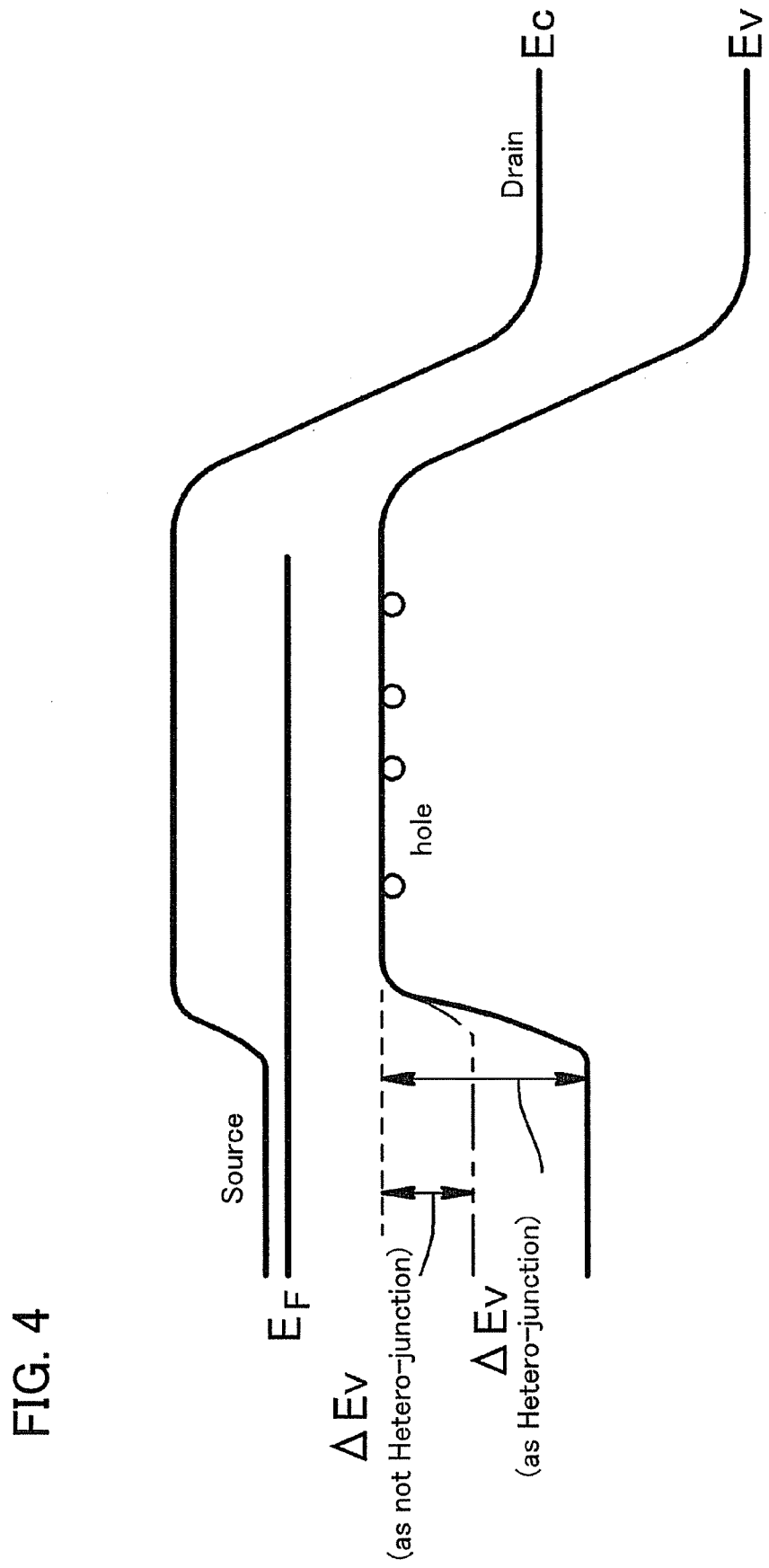
FIG. 4 is a schematic diagram showing an energy band structure of a lower part of an active layer (a substrate side) of the transistor shown in FIG. 3.

In the transistor shown in FIG. 3, the active layer region 6 and the drain region 7 are formed of germanium (referred to as Ge in the drawing). Another semiconductor such as silicon or the like can also be used; however, germanium has an advantage in that its electron mobility is higher than that of silicon and writing a memory is possible with a lower drain voltage. On the other hand, the source region 5 is formed of silicon germanium (referred to as $Si_xGe_{1-x}$ in the drawing, where 0<x<1), that is, mixed crystal (or an alloy) of silicon and germanium. As a result, a heterojunction is formed at the interface between the source region 5 and the active layer region 6 which are adjacent to each other in a horizontal direction (a direction along a principal plane of a substrate). A composition ratio of silicon in silicon germanium alloy which forms the source region 5 is regulated so that the band gap (that is, the energy difference of a valence band and a conduction band) of the silicon germanium alloy is larger than the band gap of single crystal germanium (0.66 eV). Accordingly, as shown in FIG. 4, compared with the conventional case where the source region 5 is also formed of germanium (that is, the case where there is no heterojunction), the potential barrier $\Delta E_V$ of a source side is increased, and then flowing out of holes, leakage current, is reduced, whereby the retention property of the memory element can be greatly improved. For example, when the potential barrier $\Delta E_V$ is increased by 0.5 eV, the leakage current at a room temperature is decreased to exp(−0.5 eV/0.026 eV)=4×10$^{-9}$-fold based on Formula 1.

Although the combination of the semiconductor materials which form a heterojunction at the interface between the source region 5 and the active layer region 6 has a limitation on a process condition (processing temperature or the like), the band gap of the material which forms the source region 5 may be basically larger than the band gap of the material which forms the active layer region 6, and various combinations can be used. For example, when the semiconductor material of the active layer region 6 is a single crystal germanium (0.66 eV), silicon germanium (0.66 eV to 1.12 eV, which varies depending on a composition ratio of silicon), or single crystal silicon (1.12 eV) which is often used to form a transistor, any of the following materials can be used as the semiconductor material of the source region 5 (here, the band gap (eV) is put in parentheses): zinc sulfide (3.68), zinc oxide (3.35), gallium nitride (3.36), gallium phosphide (2.26), gallium arsenide (1.42), aluminum antimonide (1.58), indium phosphide (1.35), cadmium telluride (1.56), zinc telluride (2.0), zinc selenide (2.5), cadmium sulfide (2.42), cadmium selenide (1.7), silicon carbide (3.0), aluminum phosphide (3.0), and aluminum arsenide (2.25). Note that zinc oxide includes gallium-doped zinc oxide (also referred to as GZO).

When lattice matching is considered, crystal structures of a semiconductor which forms the source region 5 and a semiconductor which forms the active layer region 6 are preferably the same and a difference of the lattice constants is preferably small, because crystal defects are less likely to be generated at an interface between the source region 5 and the active layer region 6 and peeling of a semiconductor film is likely to be prevented. Accordingly, when the active layer region 6 is formed of silicon, germanium, or silicon germanium, each of silicon, germanium, and silicon germanium has a diamond structure (the lattice constant of silicon is 0.543 nm, the lattice constant of germanium is 0.564 nm, and the lattice constant of silicon germanium is 0.564 nm to 0.543 nm), whereby it is preferable to use a semiconductor having a zinc blende structure which is close to diamond structure for the source region 5. In the zinc blende structure, a semiconductor whose lattice constant is close to that of silicon, germanium, or silicon germanium is as follows (here, a lattice constant (nm) is put in parenthesis): zinc sulfide (0.542), gallium phosphide (0.545), gallium arsenide (0.565), indium phosphide (0.587), aluminum phosphide (0.545), and aluminum arsenide (0.566).

In this manner, in the transistor shown in FIG. 3, the source region 5 is formed of a semiconductor having a larger band gap than the semiconductor which forms the active layer region 6, and a heterojunction is formed at the interface between the source region 5 and the active layer region 6. When the transistor described in FIG. 3 is used as a memory element of a capacitor-less memory, the potential barrier $\Delta E_V$ of the source side is increased, and flowing out of holes which are stored in order to change a threshold voltage of a transistor is reduced; therefore, the retention property of the memory element is greatly improved. Furthermore, the active layer region preferably has a thickness of 100 nm or more so that a transistor operates as a partial depletion mode. This is because, in the case where the thickness of the active layer region is thin, the transistor operates as a complete depletion mode, the potential of the bottom of the active layer also increases, and the holes generated at a drain edge are less likely to be stored in the bottom of the active layer when the transistor is in an on state. Such a capacitor-less memory may be used not only for a DRAM but also for various applications. For example, the capacitor-less memory can be used as a memory element which stores lighting or non-lighting of each pixel in each frame time or sub-frame time in a liquid crystal driving device.

In FIGS. 5A to 5H, a manufacturing process of the transistor shown in FIG. 3 is illustrated.

Figure 5A:
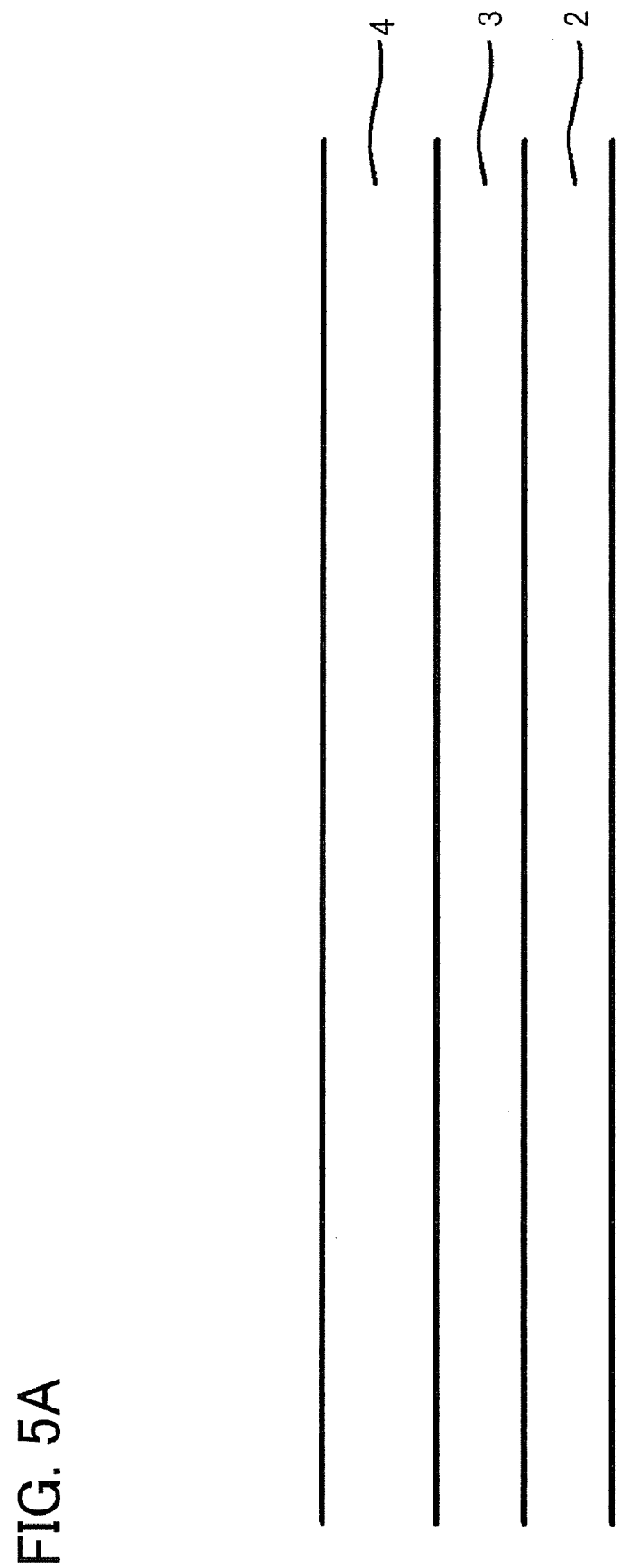
FIG. 5A is a cross-sectional view showing a manufacturing process of the transistor shown in FIG. 3.

First, as shown in FIG. 5A, a silicon oxynitride film is formed with a thickness of about 100 nm by CVD (chemical vapor deposition) or sputtering as the base insulating film 3 over the substrate 2 such as a glass substrate or the like.

Next, a germanium film is formed with a thickness of about 100 nm by CVD or the like as a semiconductor film of a transistor. When the semiconductor film 4 which is formed in this way is an amorphous, heat treatment, laser, or the like may be used to crystallize the semiconductor film 4.

Figure 5B:
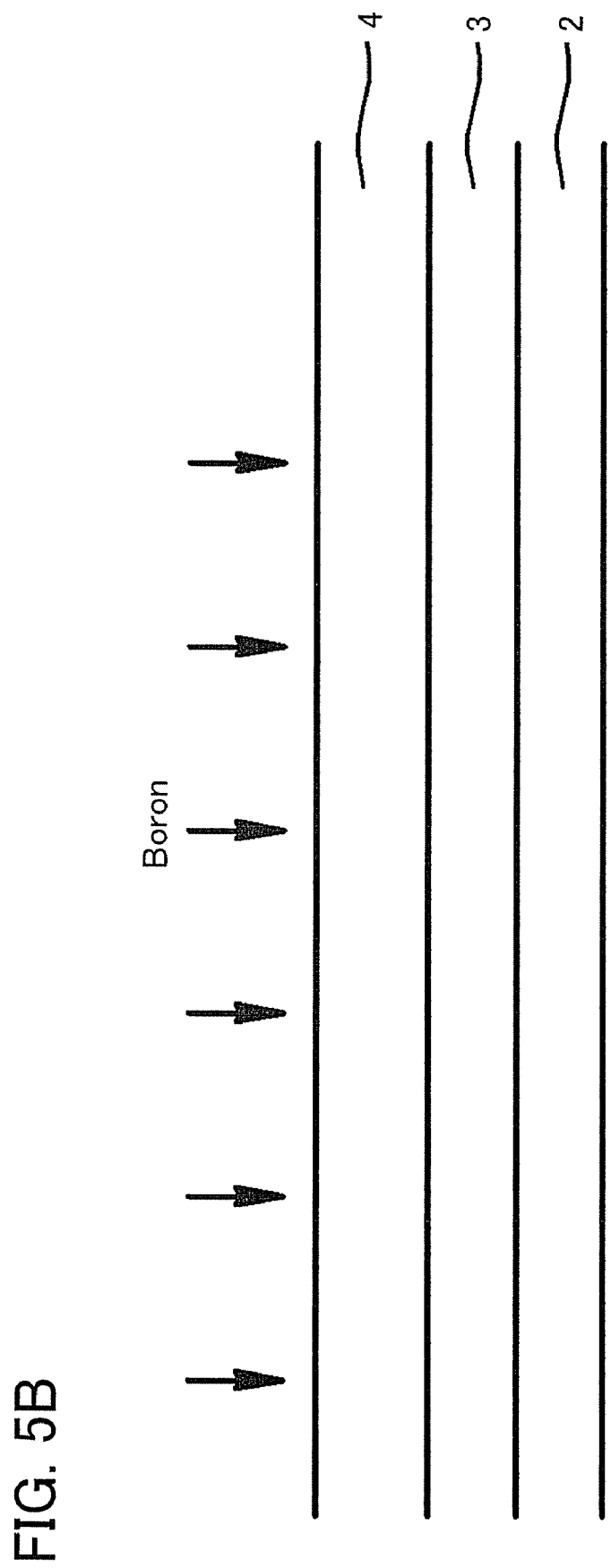
FIG. 5B is a cross-sectional view showing a manufacturing process of the transistor shown in FIG. 3.

Next, as shown in FIG. 5B, the semiconductor film 4 is doped with boron atoms as acceptor impurities by using a doping apparatus so that the whole semiconductor film 4 has p$^-$ type conductivity.

Figure 5C:
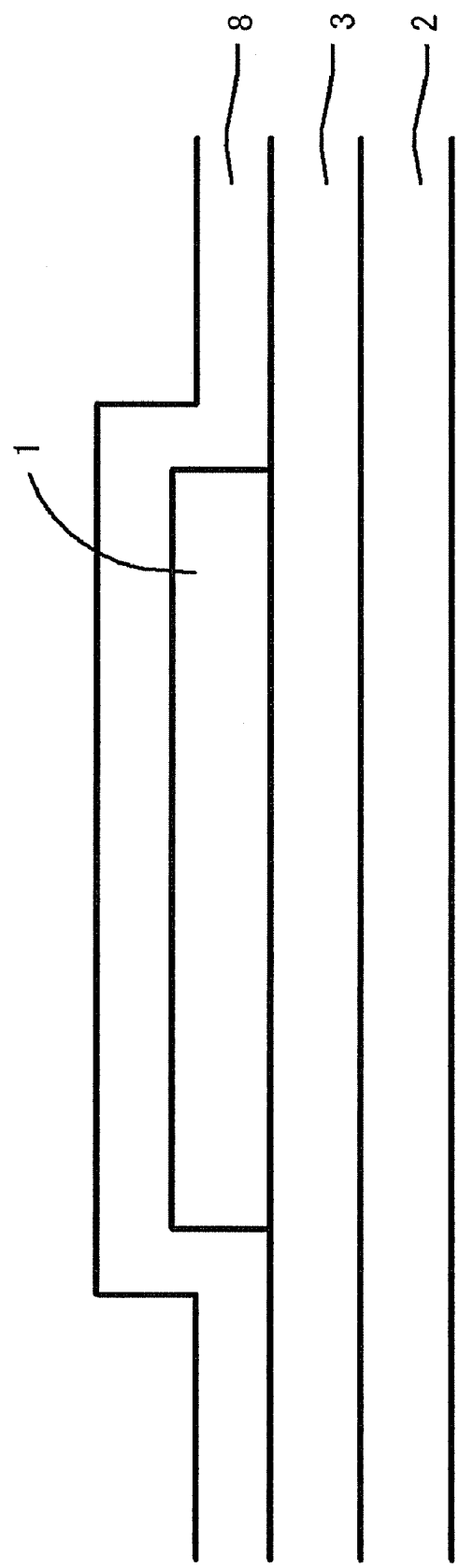
FIG. 5C is a cross-sectional view showing a manufacturing process of the transistor shown in FIG. 3.

Next, as shown in FIG. 5C, an unnecessary part of the semiconductor film 4 is etched away to form an island-shaped semiconductor. This is performed in such a way that a photoresist (not shown) is applied to a surface, and then exposed and developed so as to form a given pattern, and the semiconductor film 4 is etched by wet etching or dry etching by use of the remaining resist as a mask. Note that, instead of exposing and developing the photoresist to form a pattern as a mask, the pattern can be directly formed using an ink jet apparatus. After an island-shaped semiconductor layer 1 is formed, an yttrium oxide film is formed with a thickness of about 50 nm by CVD, MOCVD, or the like as the gate insulating film 8.

Figure 5D:
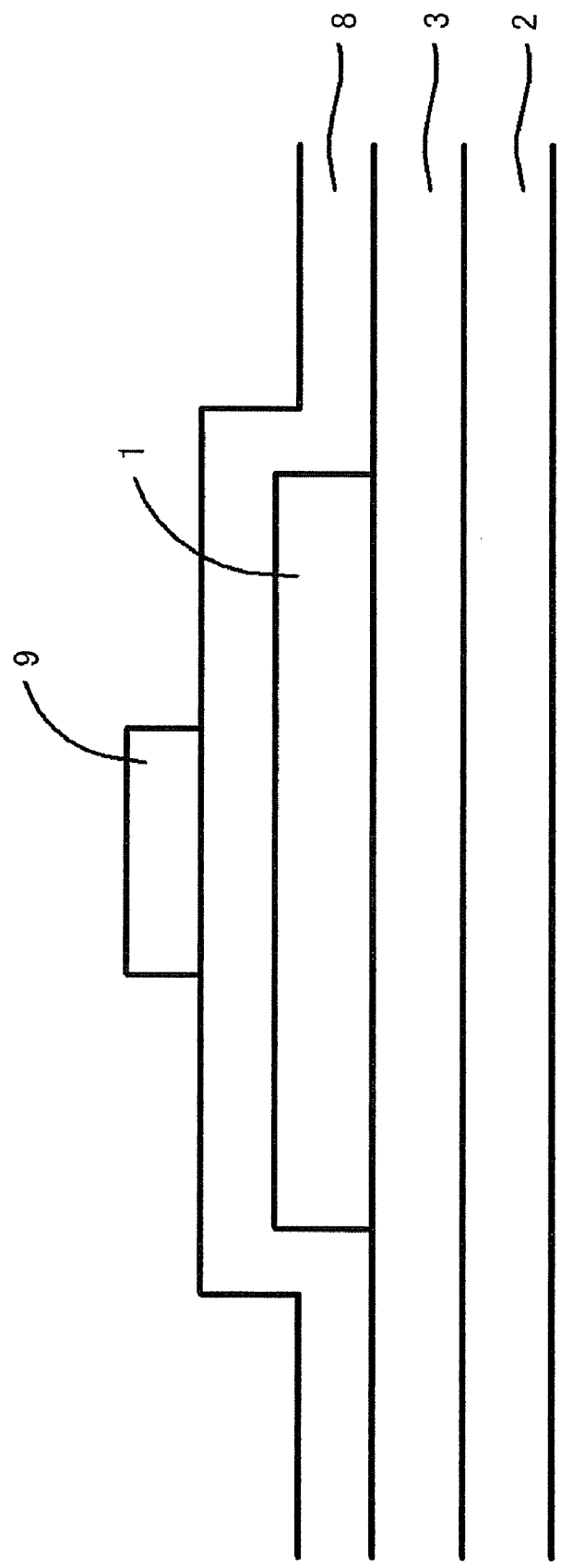
FIG. 5D is a cross-sectional view showing a manufacturing process of the transistor shown in FIG. 3.

The gate electrode 9 is formed in a step of FIG. 5D. First, to form the gate electrode 9, a tantalum nitride film is formed with a thickness of about 200 nm as a gate metal by sputtering or the like, for example. Next, a photoresist (not shown) is applied on the tantalum nitride film, and exposure and development are performed to form a given pattern. Then, the remaining photoresist is used as a mask, and the tantalum nitride film is etched by using a dry etching apparatus, a wet etching apparatus, or the like. Note that, instead of exposing and developing the photoresist to form a pattern as a mask, the pattern can be directly formed using an ink jet apparatus.

Next, as shown in FIG. 5E, to form the n+ type source region 5 and the n+ type drain region 7, the gate electrode 9 is used as a mask, and the source region 5 and the drain region 7 are doped with phosphorus or antimony as donor impurities by using a doping apparatus.

Figure 5F:
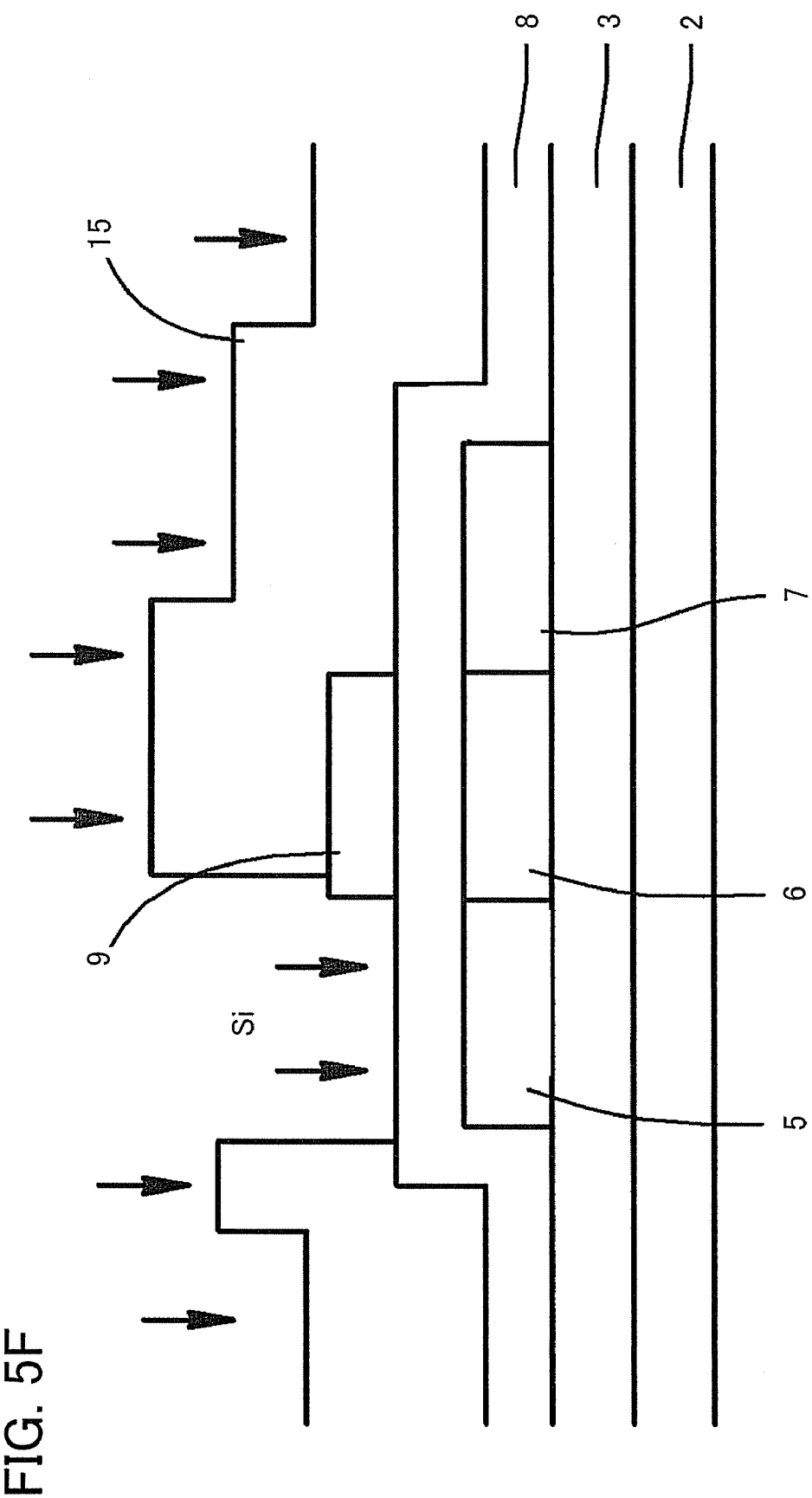
FIG. 5F is a cross-sectional view showing a manufacturing process of the transistor shown in FIG. 3.
Figure 5G:
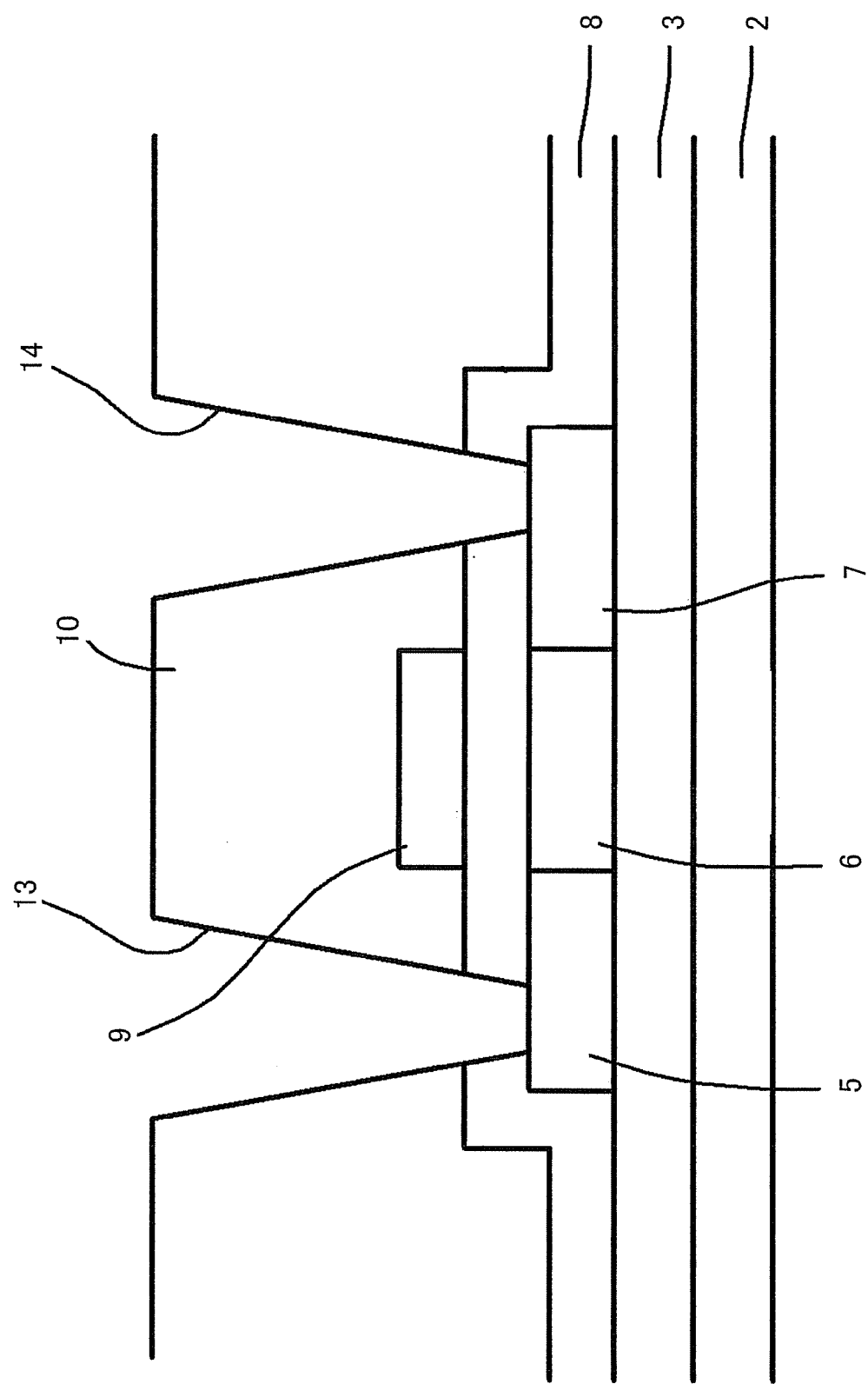
FIG. 5G is a cross-sectional view showing a manufacturing process of the transistor shown in FIG. 3.

In a process shown in FIG. 5F, a photoresist 15 is applied, and then patterning is performed by exposure and development to expose only the source region 5. Then, the patterned photoresist 15 is used as a mask, and only the source region 5 is doped with silicon atoms (referred to as Si in the drawing) by using a doping apparatus or the like. Accordingly, the source region 5 becomes a mixed crystal (or an alloy) of silicon and germanium. Even in this step, instead of exposing and developing the photoresist 15 to form a pattern as a mask, the pattern can be directly formed using an ink jet apparatus.

Next, as shown in FIG. 5Q a silicon oxynitride film is formed with a thickness of about 1000 nm by CVD or the like as the interlayer insulating film 10, a surface thereof is planarized by CMP or the like, and then etched, whereby the contact openings 13 and 14 which reach the source region 5 and the drain region 7 are formed.

In a step of FIG. 5H, a titanium film, an aluminum film, and a titanium film are stacked with thicknesses of 100 nm, 200 nm, 100 nm, respectively by sputtering or the like, a photoresist (not shown) or the like which is patterned as appropriate is used as a mask, and etching is performed to form the conductive film 11 which is connected to the source region 5 and functions as a common line and the conductive film 12 which is connected to the drain region 7 and functions as a bit line. Accordingly, the transistor shown in FIG. 3 is obtained.

Note that, in the transistor shown in FIG. 3, only the source region 5 is formed of the semiconductor having a larger band gap than the semiconductor of the active layer region 6; however, the drain region 7 may also be formed of a semiconductor having a larger band gap than the semiconductor of the active layer region 6 in order to prevent holes stored in the bottom of the semiconductor film 4 from flowing out to a drain region 7. However, when the band gap of the drain region 7 is increased, generation efficiency of electrons and holes due to hot carriers is decreased. This is because it is required that the energy of hot carriers is larger than that of the band gap so that hot carriers collide with atoms that form a semiconductor to generate electrons and holes. Therefore, when the band gap of the drain region 7 is increased, it is necessary to increase a drive voltage (that is, a drain voltage) of the transistor (the capacitor-less memory) so as to generate hot carriers which have enough energy to generate electrons and holes. In addition, when the band gap of the drain region 7 is increased, holes are less likely to be discharged from the drain region 7 side; therefore, an erasing failure of a memory element easily occurs. For these reasons, it is not preferable that the band gap of the drain region 7 be as large as the band gap of the source region 5. Therefore, when both the source region 5 and the drain region 7 are formed of semiconductors having larger band gaps than the active layer region 6, it is necessary to satisfy the following relationship: the band gap of the source region 5>the band gap of the drain region 7>the band gap of the active layer region 6. In addition, it is preferable that the difference of the band gaps of the source region 5 and the drain region 7 be as large as possible.

FIG. 6 is a modification of the transistor which is shown in FIG. 3. In FIG. 6, portions similar to those described in FIG. 3 are denoted with the same reference numerals, and detailed description thereof is omitted. In a transistor of FIG. 6, a metal film 16 is formed over the substrate 2, and the base insulating film 3 is formed thereover. Then, the conductive film 11 that functions as a common line is formed over the gate insulating film 8, the source region 5 formed of silicon germanium and the metal film 16 over the substrate 2 are connected to each other at this conductive film 11 through openings 17 and 18 which penetrate the gate insulating film 8 and the base insulating film 3. That is, a ground potential is provided by the metal film 16 formed over the substrate 2 in this transistor as a capacitor-less memory.

Figure 7:
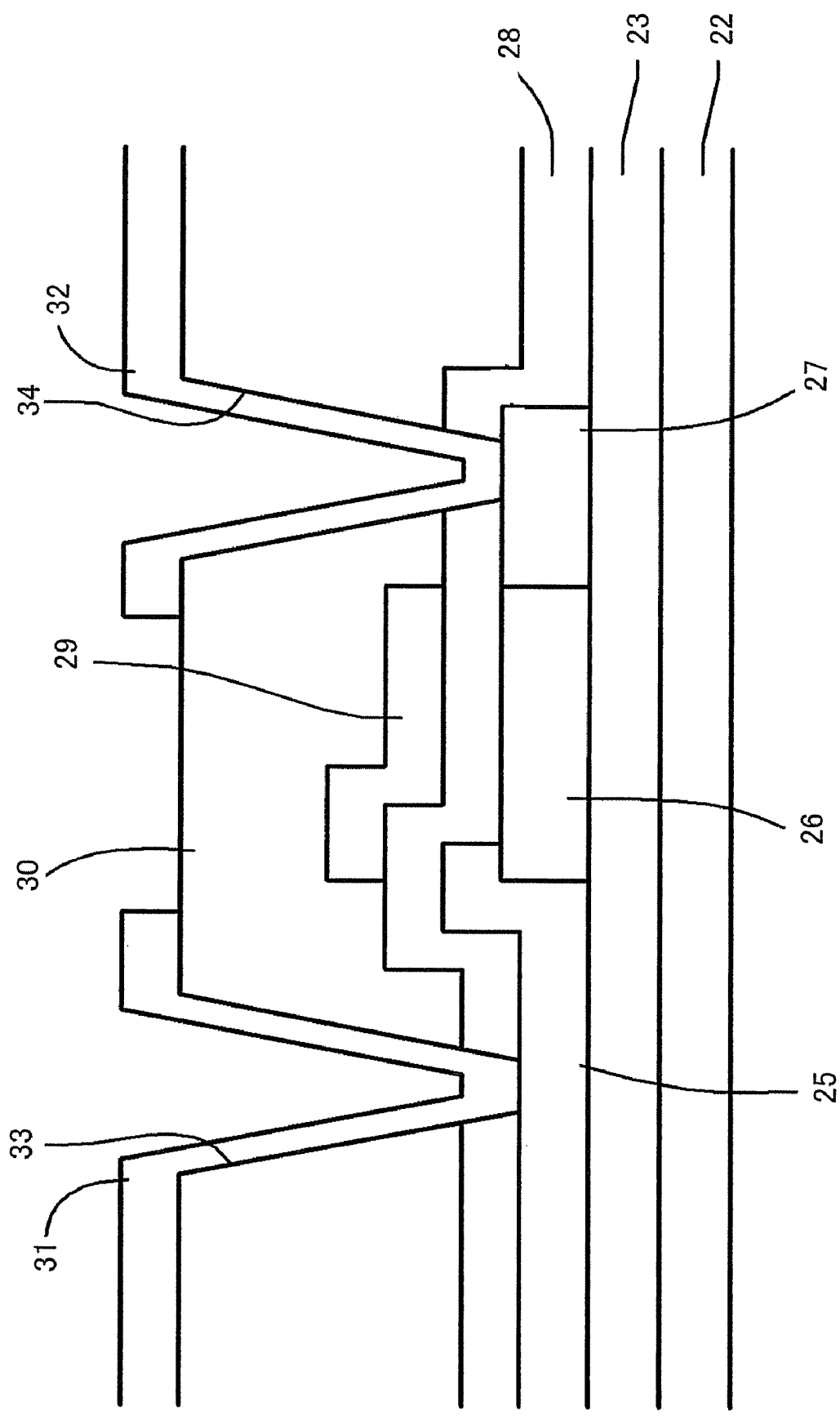
FIG. 7 is a cross-sectional view showing another embodiment of a transistor which can be used for a capacitor-less memory based on the present invention.

FIG. 7 is a cross-sectional view which shows an alternative embodiment of a transistor which can be used as a capacitor-less memory based on the present invention. In this transistor, a buried oxide (BOX) layer as a base insulating film 23 is formed over a single crystal silicon substrate 22. An island-shaped semiconductor formed of single crystal silicon which includes a source region 25, an active layer region 26, and a drain region 27 is formed over the base insulating film 23. That is, this transistor is formed by SIMOX (separation by implanted oxygen) technique. When a device such as a transistor or the like is formed over a SIMOX substrate, compared with the case where bulk silicon is used for a substrate, parasitic capacitance can be suppressed, and an advantage such as speedup, low power consumption, or the like of a device can be obtained.

A GZO (gallium-doped zinc oxide) film that functions as the source region 25 is provided adjacent to the active layer region 26. A gate electrode 29 formed of tantalum nitride is provided over the active layer region 26 and the source region 25 with a gate insulating film 28 formed of hafnium silicate nitride interposed therebetween. An interlayer insulating film 30 formed of silicon oxynitride which has a planarized surface is provided over the gate electrode 29, and conductive films 31 and 32 which are formed of a stack of a titanium film, an aluminum film, and a titanium film are formed over the interlayer insulating film 30. Contact openings 33 and 34 which reach the source region 25 and the drain region 27 are formed in the interlayer insulating film 30. The conductive films 31 and 32 are connected to the source region 25 and the drain region 27 through these contact openings 33 and 34, respectively. The conductive film 31 connected to the source region 25 can function as a common line, and the conductive film 32 connected to the drain region 27 can function as a bit line. The base insulating film 23 can be formed of silicon oxynitride instead of silicon oxide.

The drain region 27 has n+ type conductivity, and the active layer region 26 has p− type conductivity. That is, the transistor is formed as an n-type MISFET.

In the transistor of FIG. 7, the active layer region 26 and the drain region 27 are formed of single crystal silicon. On the other hand, the source region 25 is formed of GZO, and as a result, a heterojunction is formed at the interface between the source region 25 and the active layer region 26. Since the band gap of GZO is about 3.35 eV and larger than the band gap of single crystal silicon of 1.12 eV, the potential barrier $\Delta E_v$ of the source side is increased and then flowing out of stored carriers is prevented or reduced, with the result that the retention property of the memory element can be improved, similarly to the transistor of FIG. 3.

Note that, in the transistor of FIG. 7, the active layer region 26 and the drain region 27 are formed of silicon; therefore, hafnium silicate nitride which has good affinity with silicon is used for the gate insulating film 28.

In FIGS. 8A to 8I, a manufacturing process of the transistor shown in FIG. 7 is shown.

First, as shown in FIG. 8A, a SIMOX substrate is prepared in which the semiconductor film 24 formed of single crystal silicon is provided with a thickness of about 50 nm over an buried oxide (BOX) layer that functions as the base insulating film 23 formed in the single crystal silicon substrate 22.

Such a SIMOX substrate can be formed in such a way that the single crystal silicon substrate 22 is doped with oxygen ions and an oxygen containing layer is formed at a given depth, and then heat treatment is performed at 800° C. to 1200° C. to change the oxygen containing layer into a BOX layer. The part of the single crystal silicon substrate 22 over the BOX layer becomes the semiconductor film 24 formed of single crystal silicon. The depth where the oxygen containing layer is formed is adjusted, whereby the thickness of the semiconductor film 24 can be adjusted. Note that an SOI (silicon on insulator) substrate formed by Smart Cut (a registered trademark) technique, ELTRAN (a registered trademark) technique as well as SIMOX technique can also be used.

Next, as shown in FIG. 8B, the semiconductor film 24 is doped with boron atoms as acceptor impurities by using a doping apparatus so that the whole semiconductor film 24 has $p^-$ type conductivity.

Figure 8C:
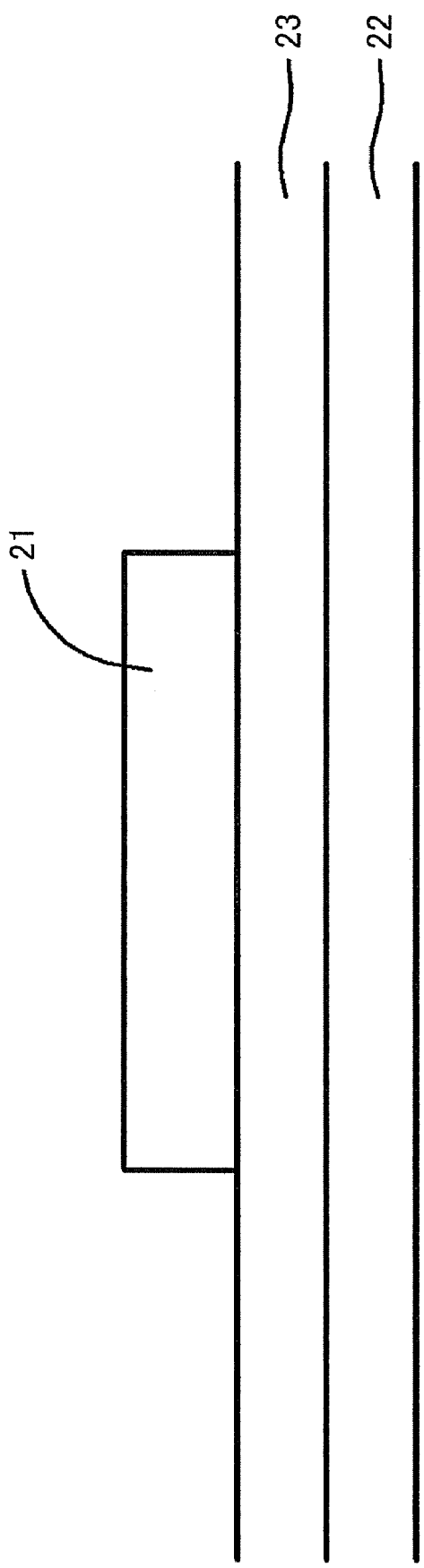
FIG. 8C is a cross-sectional view showing a manufacturing process of the transistor shown in FIG. 7.

Next, as shown in FIG. 8C, an unnecessary part of the semiconductor film 24 is etched away to form an island shape semiconductor. This is performed in such a way that a photoresist (not shown) is formed, and then exposed and developed so as to form a given pattern, and then the semiconductor film 24 is etched by wet etching or dry etching by using the remaining resist as a mask. Note that, instead of exposing and developing the photoresist to form a pattern, a pattern can be directly formed using an ink jet apparatus.

Figure 8D:
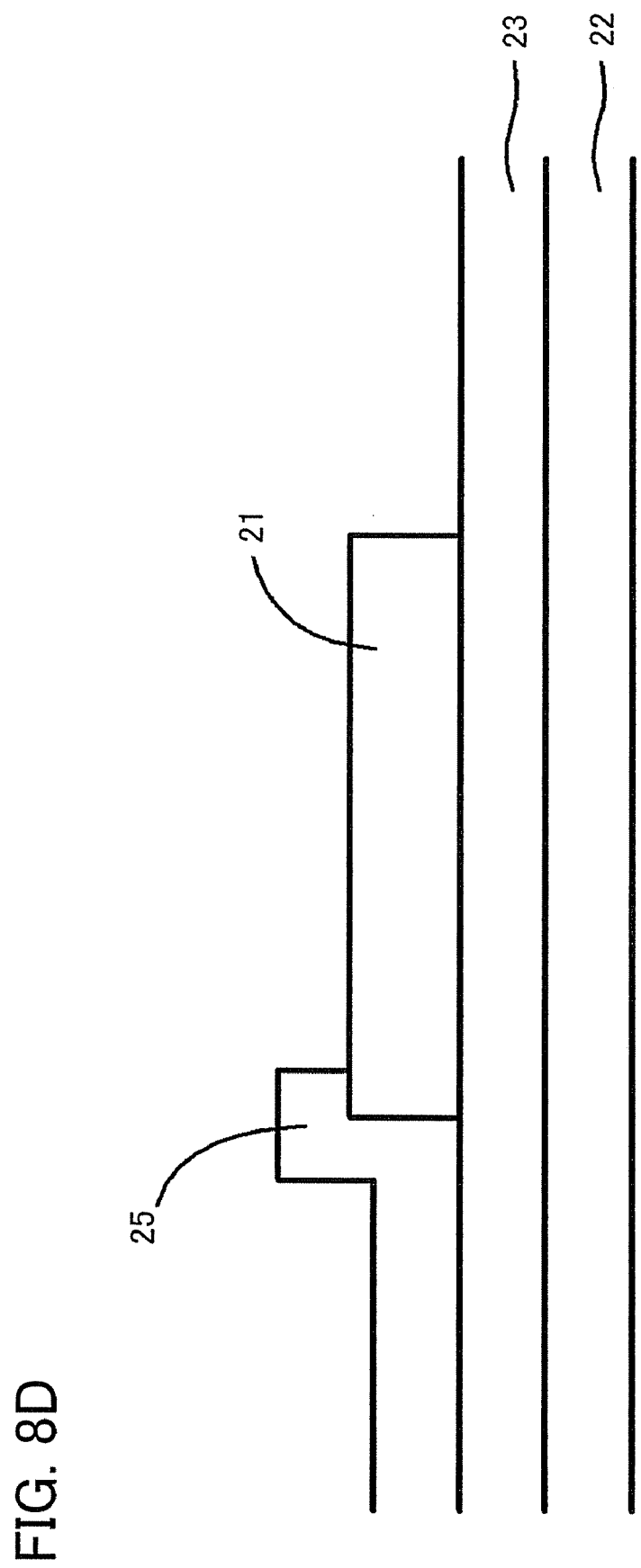
FIG. 8D is a cross-sectional view showing a manufacturing process of the transistor shown in FIG. 7.

In a step of FIG. 8D, a GZO film is formed with a thickness of about 50 nm by using a sputtering apparatus or the like, a patterned resist (not shown) or the like is used as a mask, and this GZO film is etched to form a GZO film which is adjacent to an island-shaped semiconductor layer 21. This GZO film functions as the source region 25 of a transistor.

Figure 8E:
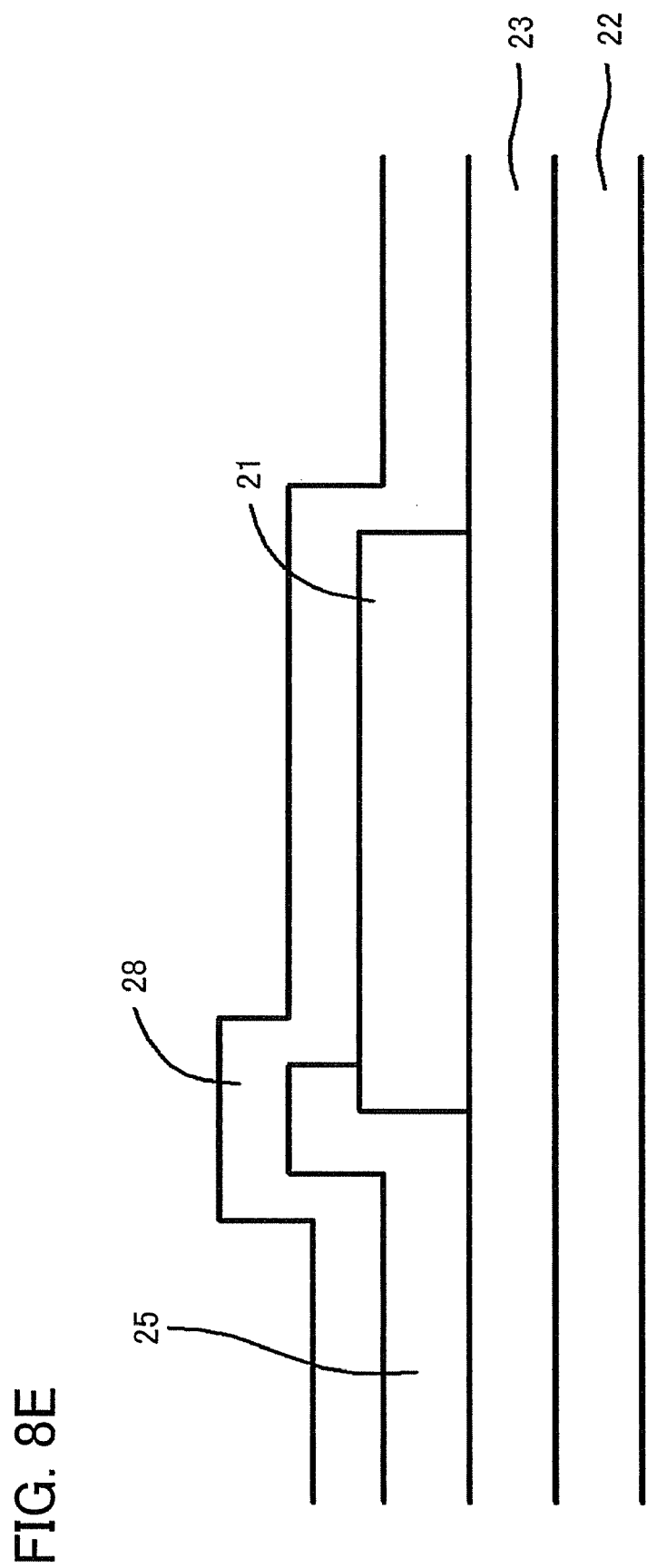
FIG. 8E is a cross-sectional view showing a manufacturing process of the transistor shown in FIG. 7.

After the source region 25 is formed, a hafnium silicate nitride film is formed with a thickness of about 50 nm by CVD, MOCVD, or the like as the gate insulating film 28 (FIG. 8E).

Figure 8F:
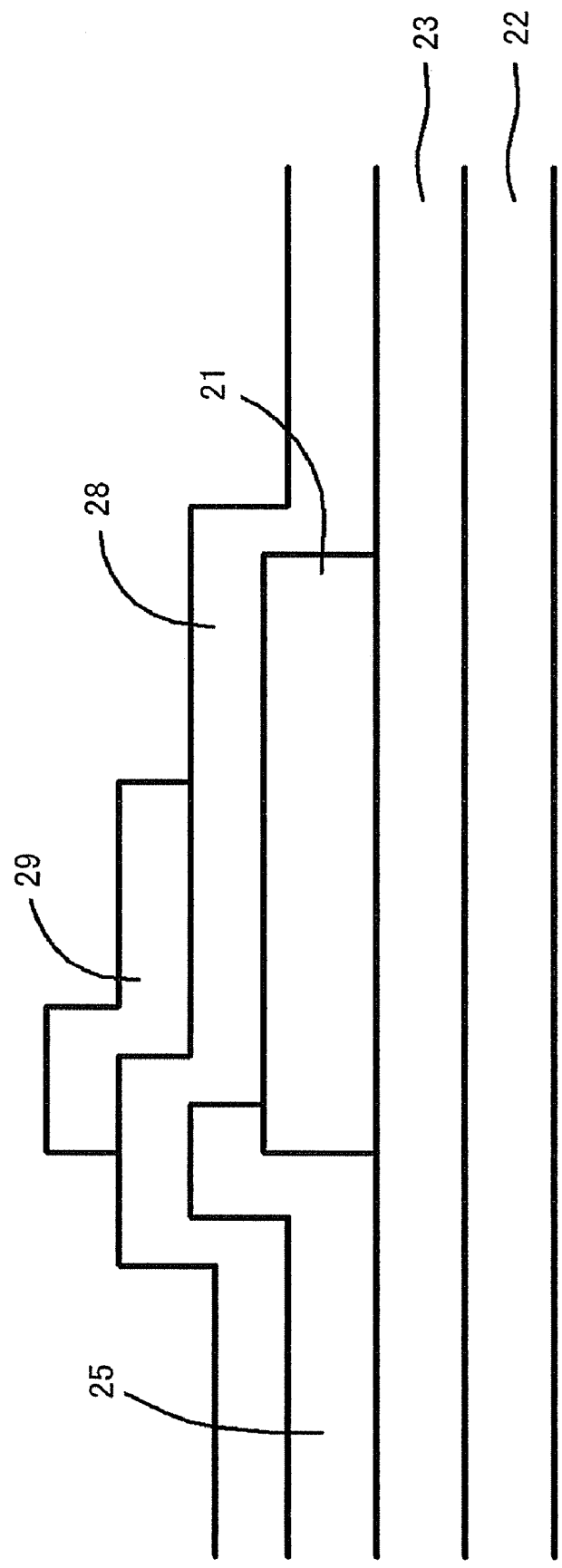
FIG. 8F is a cross-sectional view showing a manufacturing process of the transistor shown in FIG. 7.

The gate electrode 29 is formed in the step of FIG. 8F. This gate electrode 29 can be formed by a method similar to the method of the gate electrode 9 shown in FIG. 5D.

Next, as shown in FIG. 8G, to form the $n^+$ type drain region 27, a photoresist mask 35 is formed so that a portion to be the drain region 27 of the island-shaped semiconductor layer 21 is exposed, and the drain region 27 is doped with phosphorus or antimony as donor impurities by using a doping apparatus.

Next, as shown in FIG. 8H, a silicon oxynitride film is formed with a thickness of about 1000 nm by CVD or the like as the interlayer insulating film 30, and a surface thereof is planarized by CMP or the like, and then etched to form the contact openings 33 and 34 which reach the source region 25 and the drain region 27.

Figure 8I:
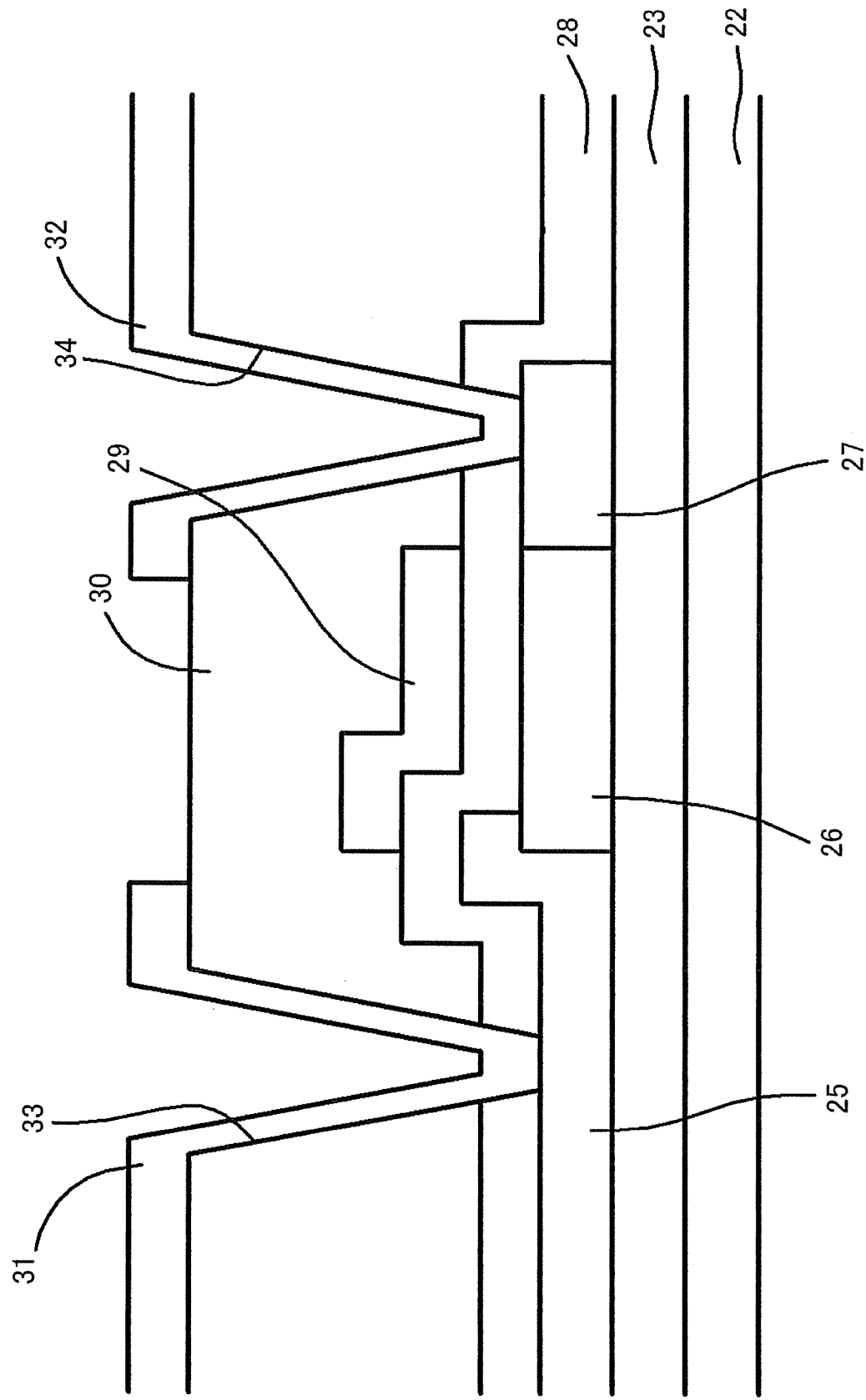
FIG. 8I is a cross-sectional view showing a manufacturing process of the transistor shown in FIG. 7.

In a step of FIG. 8I, by a similar method described in FIG. 5H, the conductive film 31 which is connected to the source region 25 and functions as a common line and the conductive film 32 which is connected to the drain region 27 and functions as a bit line are formed. Accordingly, the transistor for a capacitor-less memory shown in FIG. 7 can be obtained.

Figure 9:
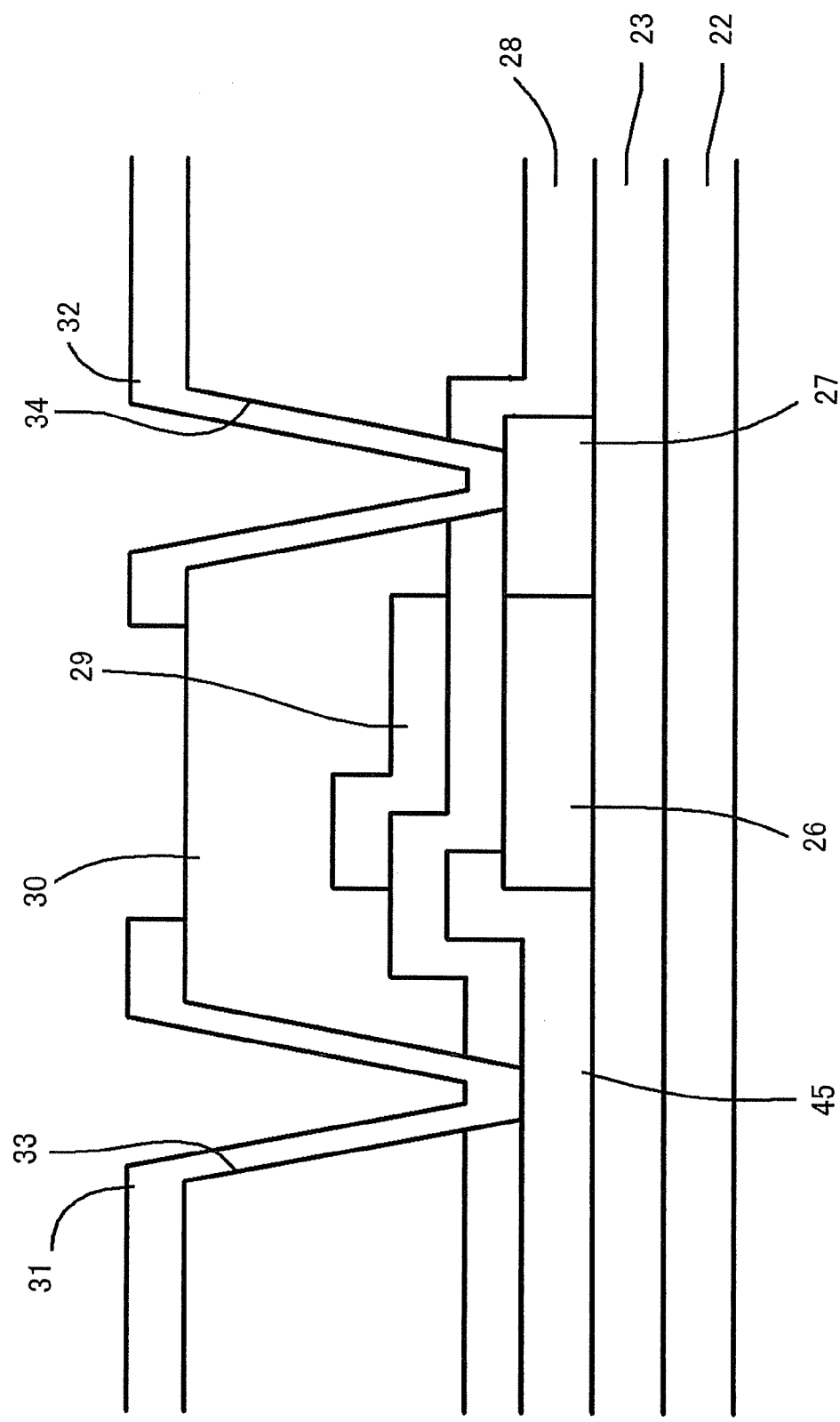
FIG. 9 is a cross-sectional view showing another embodiment of a transistor which can be used for a capacitor-less memory based on the present invention.

FIG. 9 is a cross-sectional view which shows a modification of the transistor shown in FIG. 7. A transistor of FIG. 9 is different from the transistor of FIG. 7 in that, instead of the GZO film, a source region 45 formed of amorphous silicon which has $n^+$ conductivity is provided adjacent to the active layer region 26 formed of single crystal silicon and a heterojunction of amorphous silicon and single crystal silicon is formed at the interface between the source region 45 and the active layer region 26. Although the band gap of amorphous silicon depends on the concentration of hydrogen atoms to be contained, the band gap of amorphous silicon is about 1.4 eV to 1.8 eV and larger than the band gap of single crystal silicon of 1.12 eV. Therefore, similarly to the transistor of FIG. 3 and the transistor of FIG. 7, the potential barrier $\Delta E_v$ of the source side is increased, and flowing out of stored carriers is prevented or reduced, whereby the retention property of the memory element can be improved. In addition, the active layer region 26 and the source region 45 are formed of silicon materials (single crystal silicon and amorphous silicon) so that an advantage in that a process of film formation and processing can be simplified is obtained. Further, microcrystal silicon having a grain size of several nm can be used instead of amorphous silicon. The band gap of microcrystal silicon depends on a grain size; however, the band gap of microcrystal silicon is larger than that of single crystal silicon due to the quantum size effect.

The transistor shown in FIG. 9 can be formed in such a way that, instead of the GZO film, an amorphous silicon film which contains phosphorus atoms at high concentration is formed in the step shown in FIG. 8D to form an $n^+$ amorphous silicon film which functions as the source region 45, and the rest of steps are performed similarly to FIGS. 8A to 8C, 8E, and 8F. After the amorphous silicon film is formed, the amorphous silicon film may be doped with phosphorus atoms by using another appropriate mask or the like.

Figure 10:
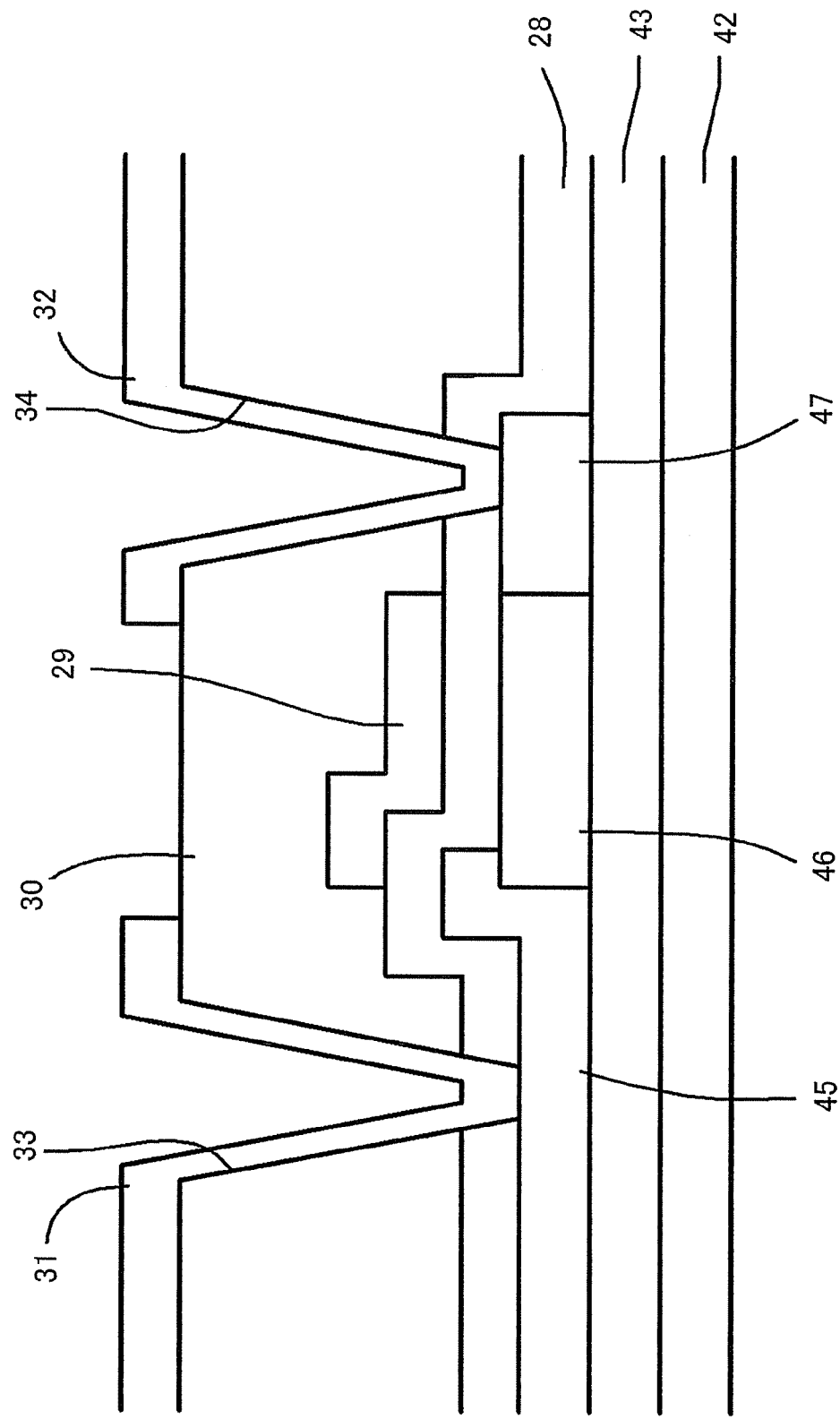
FIG. 10 is a cross-sectional view showing a modification of the transistor shown in FIG. 9.

FIG. 10 is a cross-sectional view which shows a modification of the transistor shown in FIG. 9. A transistor of FIG. 10 is different from the transistor shown in FIG. 9 in that an island-shaped semiconductor layer is formed over a silicon oxynitride film which is used as a base insulating film 43 formed over a silicon substrate 42, and this island-shaped semiconductor layer includes an active layer region 46 and a drain region 47 which are formed of polysilicon instead of single crystal silicon. Since the band gap of polysilicon is almost the same as that of single crystal silicon, the source region 45 is formed of amorphous silicon having a larger band gap than polysilicon; therefore, the potential barrier $\Delta E_v$ of the source side is increased, and then flowing out of holes stored in the bottom of the active layer region 46, leakage current, is reduced, whereby the retention property of the memory element can be greatly improved.

Figure 11A:
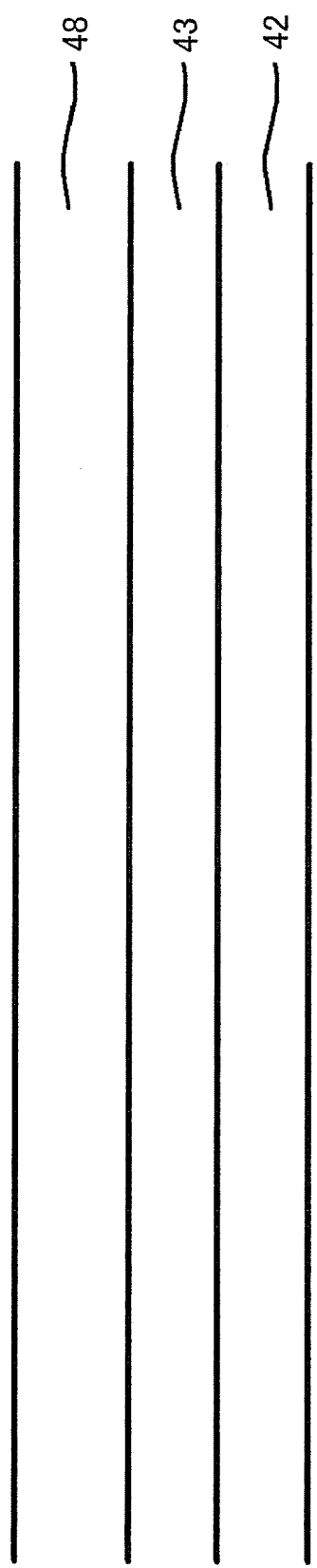
FIG. 11A is a cross-sectional view showing a manufacturing process of the transistor shown in FIG. 10.

In the manufacture of the transistor shown in FIG. 10, first, as shown in FIG. 11A, a silicon oxynitride film is formed with a thickness of about 100 nm by CVD (chemical vapor deposition) or sputtering as the base insulating film 43 over the substrate 42 such as a silicon substrate or the like, and an amorphous silicon film 48 is formed over this base insulating film 43 by CVD or the like.

Figure 11B:
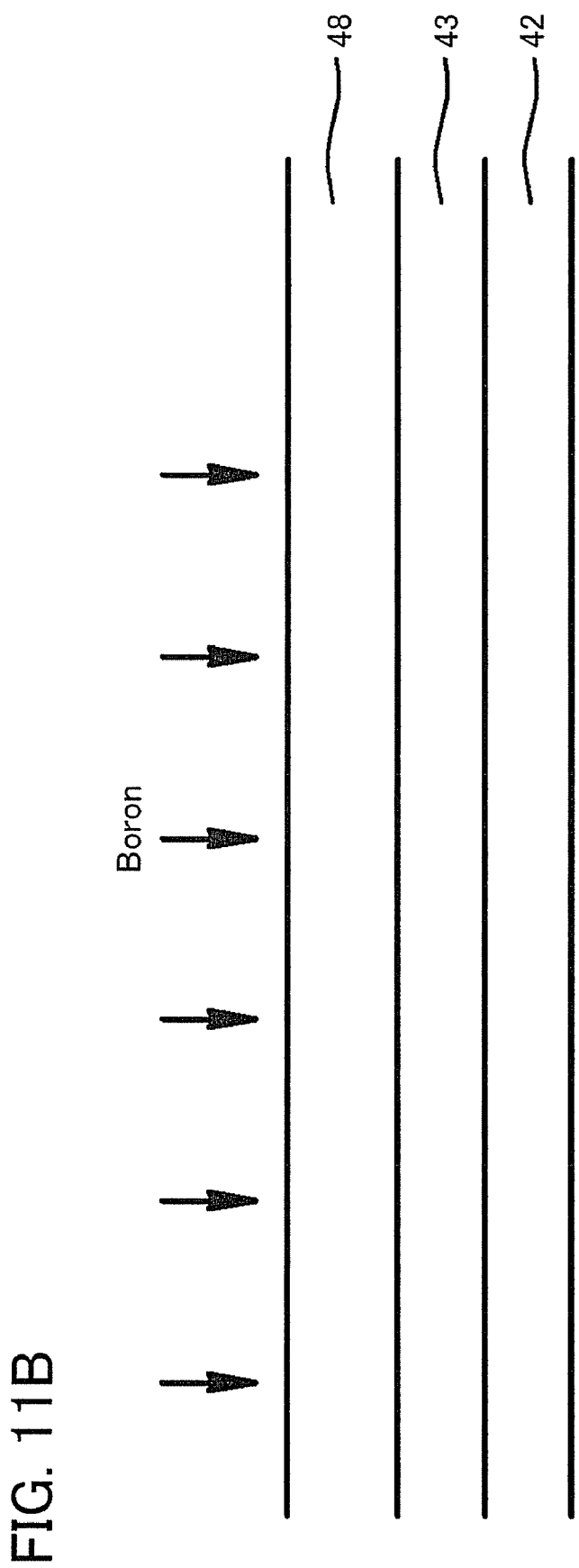
FIG. 11B is a cross-sectional view showing a manufacturing process of the transistor shown in FIG. 10.

Next, as shown in FIG. 11B, the amorphous silicon film 48 is doped with boron atoms as acceptor impurities by using a doping apparatus so that the whole amorphous silicon film 48 has $p^-$ type conductivity.

Figure 11C:
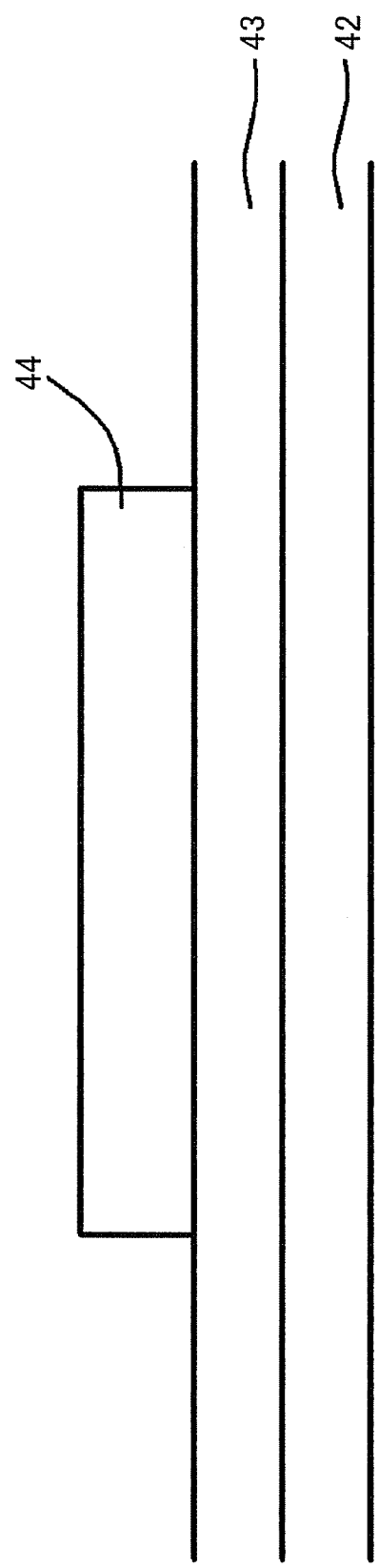
FIG. 11C is a cross-sectional view showing a manufacturing process of the transistor shown in FIG. 10.

Next, as shown in FIG. 11C, the amorphous silicon film 48 is subjected to laser treatment or heat treatment to be polycrystalline, and patterning is performed to form an island-shaped polysilicon layer 44.

Figure 11D:
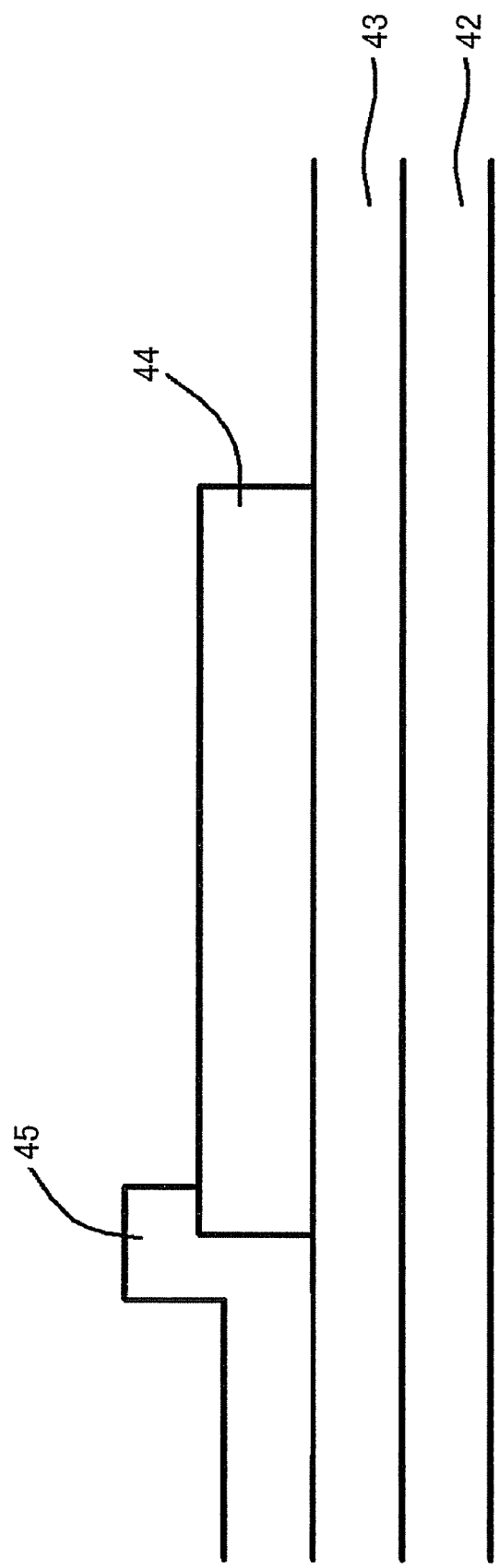
FIG. 11D is a cross-sectional view showing a manufacturing process of the transistor shown in FIG. 10.

In a step of FIG. 11D, the source region 45 formed of an amorphous silicon film which contains phosphorus atoms at high concentration is formed by CVD or the like, and patterning is performed to form the source region 45 which is adjacent to the polysilicon layer 44.

Then, by a process which is similar to that shown in FIGS. 8E to 8I, the gate insulating film 28, the gate electrode 29, the interlayer insulating film 30, and the conductive films 31 and 32 are formed, and the drain region 47 is doped with phosphorus atoms to form the transistor shown in FIG. 10.

In this manner, in the transistor shown in FIG. 10, both manufacture of the source region 45 and manufacture of the active layer region 46 and the drain region 47 include a process of forming an amorphous silicon film and can use the same amorphous-silicon film-formation apparatus; therefore, production facility and a film formation process can be simplified.

Figure 12:
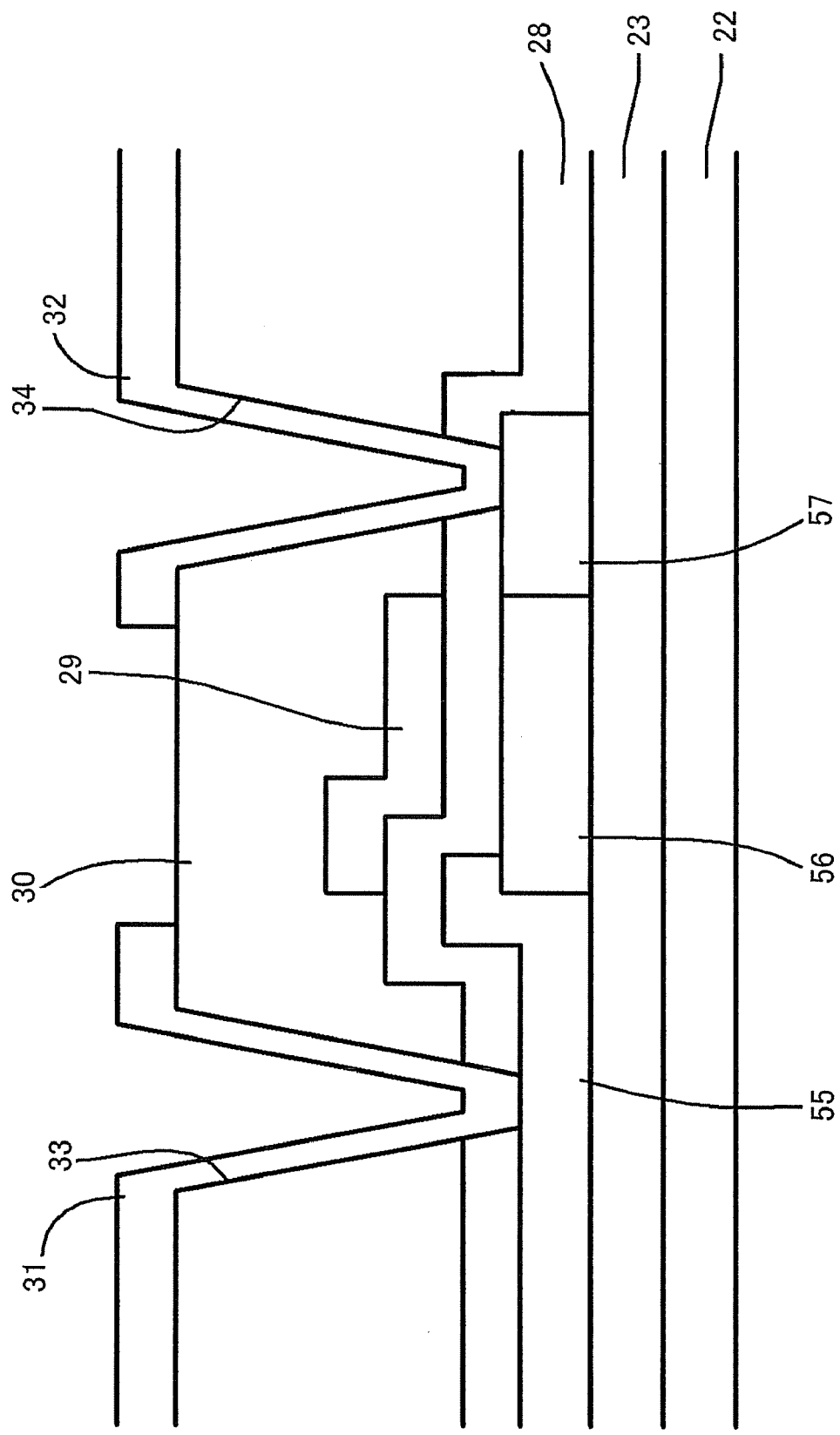
FIG. 12 is a cross-sectional view showing another embodiment of a transistor which can be used for a capacitor-less memory based on the present invention.

FIG. 12 is a cross-sectional view which shows another modification of the transistor shown in FIG. 7. A transistor of FIG. 12 is different from the transistor of FIG. 7 in that an n⁻ type active layer region 56, a p⁺ type drain region 57, and a p⁺ type source region 55 are included. That is, the transistor of FIG. 12 is formed as a p-type MISFET. In this transistor, instead of holes, electrons are stored in the bottom of the active layer region 56, whereby a threshold voltage can be changed and information can be stored.

In the transistor of FIG. 12, the source region 55 is formed of amorphous silicon, whereas the active layer region 56 and the drain region 57 are formed of single crystal silicon. A heterojunction of amorphous silicon and single crystal silicon is formed at the interface between the source region 55 and the active layer region 56. As described above, the band gap of amorphous silicon is larger than the band gap of single crystal silicon; therefore, the potential barrier $\Delta E_V$ of the source side is increased, and flowing out of electrons stored in the bottom of the active layer region 56, leakage current, is decreased, whereby the retention property of the memory element can be greatly improved.

The transistor of FIG. 12 can be formed using a process similar to the process shown in FIGS. 8A to 8I, except that the semiconductor film is doped with phosphorus atoms at low concentration ($10^{15}$/cm³ to $10^{16}$/cm³) instead of boron atoms to be an n⁻ type in the step of FIG. 8B, a p⁺ type amorphous silicon film doped with boron atoms at high concentration ($10^{19}$/cm³ to $10^{20}$/cm³) is formed and patterned as the source region 55 instead of the GZO film in the step of FIG. 8D, the drain region 57 is doped with boron atoms at high concentration ($10^{19}$/cm³ to $10^{20}$/cm³) instead of phosphorus atoms to form the p⁺ type drain region 57 in the step of FIG. 8G.

Figure 13:
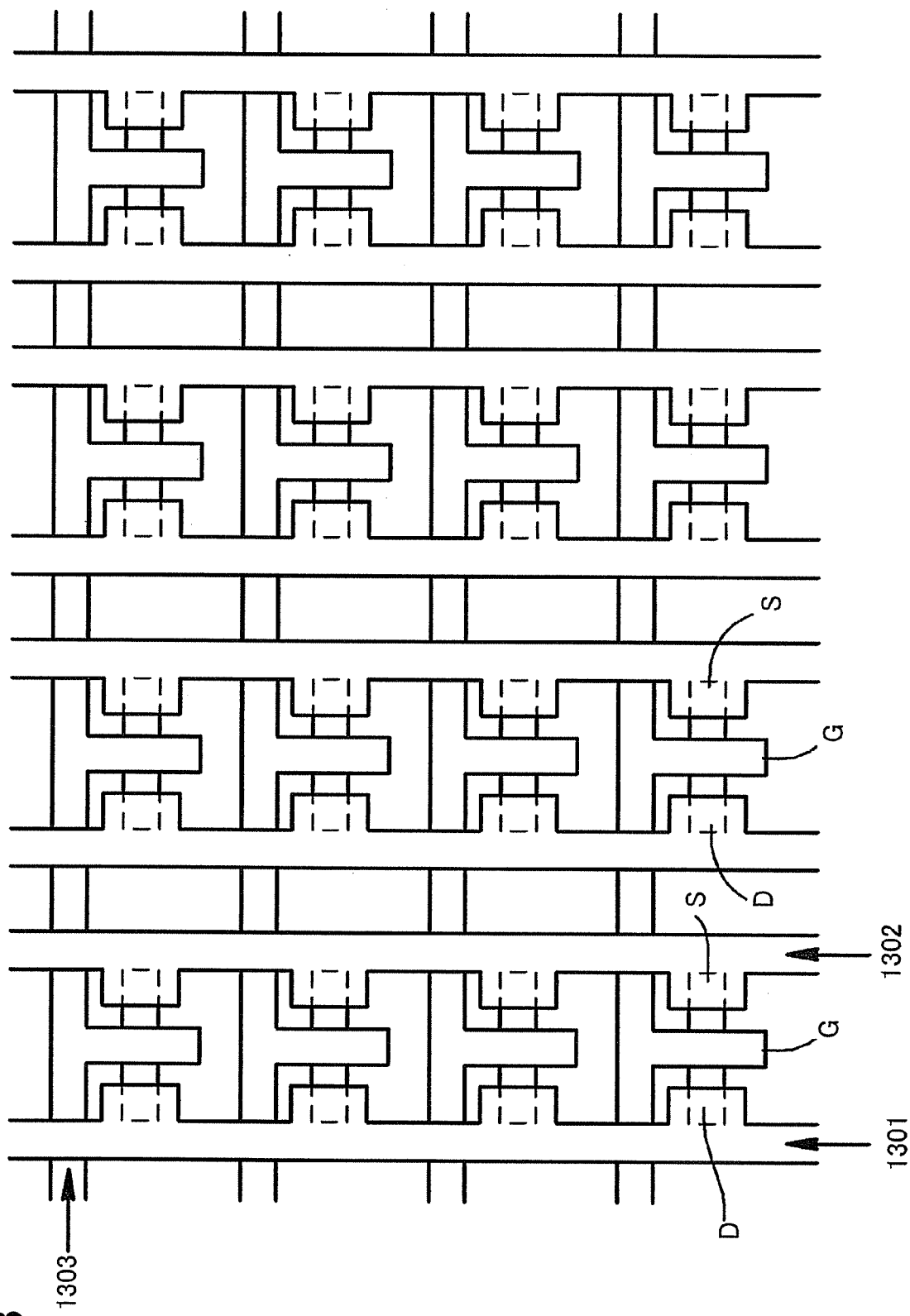
FIG. 13 is a schematic plan view showing an example of a memory array using a transistor having a heterojunction based on the present invention.

FIG. 13 is a schematic plan view which shows an example of a memory array using the above transistor having a heterojunction based on the present invention. In FIG. 13, bit lines 1301 and common lines 1302 are alternatingly arranged in parallel with each other in a longitudinal direction in the drawing, word lines 1303 extend in a horizontal direction in the drawing so as to be perpendicular to the bit lines 1301 and the common lines 1302, and transistors which each function as a memory cell are formed at each intersection of the bit lines 1301 and the word lines 1303. The word lines 1303 are each connected to respective gates G of the transistors, the bit lines 1301 are each connected to respective drains D of the transistors, and the common lines 1302 are each connected to respective sources S of the transistors. Accordingly, appropriate potential is applied to a given word line 1303 and a given bit line 1301, whereby reading or writing of the memory cell which is located at the intersection of these can be performed.

Figure 14:
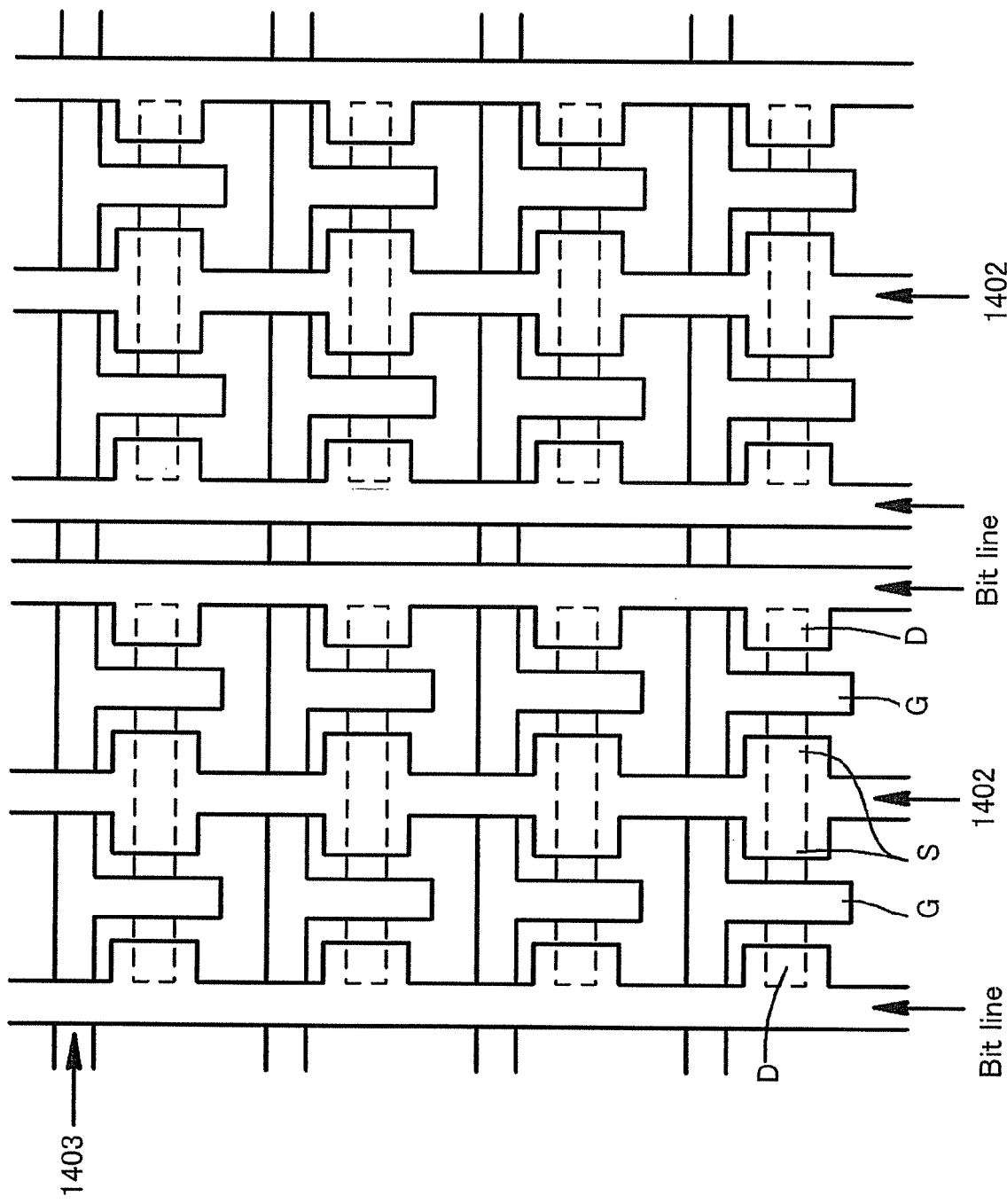
FIG. 14 is a schematic plan view showing a modification of FIG. 13.

FIG. 14 is a schematic plan view which shows a modification of FIG. 13. A memory array of FIG. 14 is different from the memory array of FIG. 13 in that the sources S of adjacent transistors with a common line 1402 interposed therebetween in the horizontal direction (that is, a direction along which a word line 1403 extends) are closely arranged, and these sources S are connected to the same common line 1402 that is located therebetween. In this manner, in the memory array of FIG. 14, the same common line 1402 is used between adjacent memory cells so that the number of common lines 1402 can be reduced, which is advantageous in miniaturization.

The present invention is described in detail based on embodiments above; however, these embodiments are just examples, and the present invention is not limited to these embodiments. The present invention can be transformed and modified by those skilled in the art in various ways without departing from the technical idea of the present invention determined by present claims.

Since the present invention can improve a memory retention property of a capacitor-less memory which uses a transistor as a memory element and thus has a simple structure, the present invention is extremely useful in industry. This application is based on Japanese Patent Application serial No. 2007-154610 filed with Japan Patent Office on Jun. 12, 2007, the entire contents of which are hereby incorporated by reference.

What is claimed is:

1. A capacitor-less memory comprising a transistor, wherein the transistor comprises:
   a source region;
   a drain region;
   an active layer region which is provided between the source region and the drain region; and
   a gate electrode which is adjacent to the active layer region with an insulating film interposed therebetween, and
   wherein the source region comprises a semiconductor having a larger band gap than a band gap of a semiconductor of the active layer region and a band gap of a semiconductor of the drain region, and a heterojunction is formed at the interface between the source region and the active layer region.

2. The capacitor-less memory according to claim 1, wherein the active layer region has a thickness of 100 nm or more.

3. The capacitor-less memory according to claim 1, wherein the active layer region and the drain region comprise semiconductors having the same band gap.

4. The capacitor-less memory according to claim 1, wherein the semiconductor of the active layer region is formed of germanium and a semiconductor of the source region is formed of silicon germanium alloy.

5. The capacitor-less memory according to claim 1, wherein the semiconductor of the active layer region is formed of a semiconductor selected from a group of silicon, germanium, and silicon germanium; and a semiconductor of the source region is formed of a semiconductor selected from a group of zinc sulfide, zinc oxide, gallium nitride, gallium phosphide, gallium arsenide, aluminum antimonide, indium phosphide, cadmium telluride, zinc telluride, zinc selenide, cadmium sulfide, cadmium selenide, silicon carbide, aluminum phosphide, and aluminum arsenide.

6. The capacitor-less memory according to claim 1, wherein the semiconductor of the source region is formed of a semiconductor selected from a group of zinc sulfide, gallium phosphide, gallium arsenide, indium phosphide, aluminum phosphide, and aluminum arsenide.

7. The capacitor-less memory according to claim 1, wherein the semiconductor of the active layer region is formed of one of single crystal silicon and polysilicon, and a semiconductor of the source region is formed of one of amorphous silicon and microcrystal silicon.

8. The capacitor-less memory according to claim 1, wherein the insulating film is formed of an insulating material having a dielectric constant of 8 or more.

9. The capacitor-less memory according to claim 1, comprising:
- a plurality of the transistors;
- a plurality of word lines each connected to respective gate electrodes of the transistors;
- a plurality of common lines each connected to respective source regions of the transistors; and
- a plurality of bit lines each connected to respective drain regions of the transistors,
- wherein the common lines and the bit lines extend almost in parallel and are almost perpendicular to the word lines,
- wherein the transistors are adjacent to each other with one of the plurality of common lines interposed therebetween in a direction along which the word lines extend, and
- wherein the source regions of the transistors which are adjacent to each other are connected to one of the plurality of common lines therebetween.

10. The capacitor-less memory according to claim 1, wherein the band gap of the semiconductor of the drain region is larger than the band gap of the semiconductor of the active layer region.

11. A capacitor-less memory comprising a transistor, wherein the transistor comprises:
- a source region;
- a drain region;
- an active layer region which is provided between the source region and the drain region; and
- a gate electrode which is adjacent to the active layer region with an insulating film interposed therebetween, and
- wherein the source region comprises a semiconductor having a larger band gap than a band gap of a semiconductor of the active layer region and a band gap of a semiconductor of the drain region, and a heterojunction is formed at the interface between the source region and the active layer region, and
- wherein the source region is in contact with the active layer region.

12. The capacitor-less memory according to claim 11 wherein the active layer region has a thickness of 100 nm or more.

13. The capacitor-less memory according to claim 11, wherein the active layer region and the drain region comprise semiconductors having the same band gap.

14. The capacitor-less memory according to claim 11, wherein the semiconductor of the active layer region is formed of germanium and a semiconductor of the source region is formed of silicon germanium alloy.

15. The capacitor-less memory according to claim 11, wherein the semiconductor of the active layer region is formed of a semiconductor selected from a group of silicon, germanium, and silicon germanium; and a semiconductor of the source region is formed of a semiconductor selected from a group of zinc sulfide, zinc oxide, gallium nitride, gallium phosphide, gallium arsenide, aluminum antimonide, indium phosphide, cadmium telluride, zinc telluride, zinc selenide, cadmium sulfide, cadmium selenide, silicon carbide, aluminum phosphide, and aluminum arsenide.

16. The capacitor-less memory according to claim 11, wherein the semiconductor of the source region is formed of a semiconductor selected from a group of zinc sulfide, gallium phosphide, gallium arsenide, indium phosphide, aluminum phosphide, and aluminum arsenide.

17. The capacitor-less memory according to claim 11, wherein the semiconductor of the active layer region is formed of one of single crystal silicon and polysilicon, and a semiconductor of the source region is formed of one of amorphous silicon and microcrystal silicon.

18. The capacitor-less memory according to claim 11, wherein the insulating film is formed of an insulating material having a dielectric constant of 8 or more.

19. The capacitor-less memory according to claim 11, comprising:
- a plurality of the transistors;
- a plurality of word lines each connected to respective gate electrodes of the transistors;
- a plurality of common lines each connected to respective source regions of the transistors; and
- a plurality of bit lines each connected to respective drain regions of the transistors,
- wherein the common lines and the bit lines extend almost in parallel and are almost perpendicular to the word lines,
- wherein the transistors are adjacent to each other with one of the plurality of common lines interposed therebetween in a direction along which the word lines extend, and
- wherein the source regions of the transistors which are adjacent to each other are connected to one of the plurality of common lines therebetween.

20. The capacitor-less memory according to claim 11, wherein the band gap of the semiconductor of the drain region is larger than the band gap of the semiconductor of the active layer region.

* * * * *